(12) United States Patent
Kliner

(10) Patent No.: US 10,069,271 B2
(45) Date of Patent: Sep. 4, 2018

(54) SCALABLE HIGH POWER FIBER LASER

(71) Applicant: nLIGHT Photonics Corporation, Vancouver (CA)

(72) Inventor: Dahv A. V. Kliner, Vancouver, WA (US)

(73) Assignee: nLIGHT, Inc., Vancouver, WA (US)

( * ) Notice: Subject to any disclaimer, the term of this patent is extended or adjusted under 35 U.S.C. 154(b) by 0 days.

(21) Appl. No.: 14/293,941

(22) Filed: Jun. 2, 2014

(65) Prior Publication Data
US 2015/0349481 A1  Dec. 3, 2015

(51) Int. Cl.
| | |
|---|---|
| *H01S 3/094* | (2006.01) |
| *H01S 3/067* | (2006.01) |
| *H01S 3/0941* | (2006.01) |
| *H01S 5/40* | (2006.01) |
| *G01B 9/02* | (2006.01) |
| *G02B 6/43* | (2006.01) |

(52) U.S. Cl.
CPC ...... *H01S 3/094042* (2013.01); *H01S 3/0675* (2013.01); *H01S 3/09408* (2013.01); *H01S 3/09415* (2013.01); *H01S 3/094053* (2013.01); *H01S 5/4012* (2013.01); *G01B 9/02* (2013.01); *G02B 6/43* (2013.01); *H01S 3/06704* (2013.01); *H01S 3/06754* (2013.01)

(58) Field of Classification Search
CPC .... H01S 3/06754; H01S 3/06758; G02B 6/43
See application file for complete search history.

(56) References Cited

U.S. PATENT DOCUMENTS

| | | | |
|---|---|---|---|
| 4,138,190 | A | 2/1979 | Bryngdahl |
| 4,252,403 | A | 2/1981 | Salisbury |

(Continued)

FOREIGN PATENT DOCUMENTS

| | | |
|---|---|---|
| DE | 4200587 | 4/1993 |
| DE | 10321102 | 12/2004 |

(Continued)

OTHER PUBLICATIONS

Ghatak et al., "Design of Waveguide Refractive Index Profile to Obtain Flat Model Field", SPIE, 3666:40-44 (Apr. 1999).

(Continued)

*Primary Examiner* — Eric L Bolda
(74) *Attorney, Agent, or Firm* — Klarquist Sparkman, LLP

(57) ABSTRACT

A modular and scalable high-power fiber laser system is configurable to generate 1 kW or more of laser output, and includes one or more separable pump modules separately disposed from each other, each pump module including a plurality of fiber-coupled component pump sources optically combined by one or more fiber-based pump module pump combiners, each pump module providing one or more pump module fiber outputs, and a gain module separately disposed from the one or more separable pump modules and including one or more gain module pump fiber inputs optically coupled to corresponding ones of the pump module fiber outputs, and including a gain fiber optically coupled to the one or more gain module pump fiber inputs, the gain fiber configured to generate a gain module fiber output power scalable in relation to the number and power of said pump module fiber outputs coupled to the gain fiber.

20 Claims, 9 Drawing Sheets

(56) References Cited

U.S. PATENT DOCUMENTS

| | | | |
|---|---|---|---|
| 4,266,851 | A | 5/1981 | Salisbury |
| 4,475,027 | A | 10/1984 | Pressley |
| 4,998,797 | A | 3/1991 | van den Bergh et al. |
| 5,153,773 | A | 10/1992 | Muraki et al. |
| 5,463,497 | A | 10/1995 | Muraki et al. |
| 5,475,415 | A | 12/1995 | Noethen |
| 5,745,284 | A | 4/1998 | Goldberg et al. |
| 5,818,630 | A | 10/1998 | Fermann et al. |
| 5,864,430 | A | 1/1999 | Dickey et al. |
| 5,903,696 | A | 5/1999 | Krivoshlykov |
| 5,909,306 | A | 6/1999 | Goldberg et al. |
| 5,986,807 | A | 11/1999 | Fork |
| 5,999,548 | A | 12/1999 | Mori et al. |
| 6,072,184 | A | 6/2000 | Okino et al. |
| 6,132,104 | A * | 10/2000 | Bliss et al. ............... 385/53 |
| 6,330,382 | B1 | 12/2001 | Harshbarger et al. |
| 6,433,301 | B1 | 8/2002 | Dunsky et al. |
| 6,434,177 | B1 * | 8/2002 | Jurgensen ............... 372/43.01 |
| 6,483,973 | B1 | 11/2002 | Mazzarese et al. |
| 6,496,301 | B1 | 12/2002 | Koplow et al. |
| 6,542,665 | B2 | 4/2003 | Reed et al. |
| 6,556,340 | B1 * | 4/2003 | Wysocki et al. ............... 359/334 |
| 6,639,177 | B2 | 10/2003 | Ehrmann et al. |
| 6,671,293 | B2 | 12/2003 | Kopp et al. |
| 6,711,918 | B1 | 3/2004 | Kliner et al. |
| 6,724,528 | B2 | 4/2004 | Koplow et al. |
| 6,772,611 | B2 | 8/2004 | Kliner et al. |
| 6,777,645 | B2 | 8/2004 | Ehrmann et al. |
| 6,801,550 | B1 * | 10/2004 | Snell et al. ............... 372/6 |
| 6,825,974 | B2 | 11/2004 | Kliner et al. |
| 6,839,163 | B1 * | 1/2005 | Jakobson ............ H01S 3/06704 359/341.1 |
| 6,882,786 | B1 | 4/2005 | Kliner et al. |
| 6,895,154 | B2 | 5/2005 | Johnson et al. |
| 6,917,742 | B2 | 7/2005 | Po |
| 6,941,053 | B2 | 9/2005 | Lauzon et al. |
| 6,963,062 | B2 | 11/2005 | Cyr et al. |
| 6,989,508 | B2 | 1/2006 | Ehrmann et al. |
| 7,068,900 | B2 | 6/2006 | Croteau et al. |
| 7,079,566 | B2 * | 7/2006 | Kido et al. ............... 372/101 |
| 7,116,887 | B2 | 10/2006 | Farroni et al. |
| 7,148,447 | B2 | 12/2006 | Ehrmann et al. |
| 7,151,787 | B2 | 12/2006 | Kulp et al. |
| 7,157,661 | B2 | 1/2007 | Amako |
| 7,170,913 | B2 * | 1/2007 | Araujo et al. ............ 372/29.011 |
| 7,184,630 | B2 | 2/2007 | Kwon et al. |
| 7,235,150 | B2 * | 6/2007 | Bischel et al. ............... 156/212 |
| 7,257,293 | B1 | 8/2007 | Fini et al. |
| 7,317,857 | B2 | 1/2008 | Manyam et al. |
| 7,359,604 | B2 | 4/2008 | Po |
| 7,382,389 | B2 | 6/2008 | Cordingley et al. |
| 7,394,476 | B2 | 7/2008 | Cordingley et al. |
| 7,421,175 | B2 | 9/2008 | Varnham |
| 7,527,977 | B1 | 5/2009 | Fruetel et al. |
| 7,537,395 | B2 | 5/2009 | Savage-Leuchs |
| 7,592,568 | B2 | 9/2009 | Varnham et al. |
| 7,593,435 | B2 | 9/2009 | Gapontsev et al. |
| 7,764,854 | B2 | 7/2010 | Fini |
| 7,783,149 | B2 | 8/2010 | Fini |
| 7,835,608 | B2 | 11/2010 | Minelly et al. |
| 7,876,495 | B1 | 1/2011 | Minelly |
| 7,880,961 | B1 | 2/2011 | Feve et al. |
| 7,920,767 | B2 | 4/2011 | Fini |
| 7,924,500 | B1 | 4/2011 | Minelly |
| 7,925,125 | B2 | 4/2011 | Cyr et al. |
| 7,955,905 | B2 | 6/2011 | Cordingley et al. |
| 7,955,906 | B2 | 6/2011 | Cordingley et al. |
| 8,027,555 | B1 | 9/2011 | Kliner et al. |
| 8,217,304 | B2 | 7/2012 | Cordingley et al. |
| 8,243,764 | B2 | 8/2012 | Tucker et al. |
| 8,270,441 | B2 | 9/2012 | Rogers et al. |
| 8,270,445 | B2 | 9/2012 | Morasse et al. |
| 8,278,591 | B2 | 10/2012 | Chouf et al. |
| 8,288,683 | B2 | 10/2012 | Jennings et al. |
| 8,362,391 | B2 | 1/2013 | Partlo et al. |
| 8,395,084 | B2 | 3/2013 | Tanaka |
| 8,509,577 | B2 | 8/2013 | Liu |
| 8,526,110 | B1 | 9/2013 | Honea et al. |
| 8,542,145 | B2 | 9/2013 | Galati |
| 8,593,725 | B2 | 11/2013 | Kliner et al. |
| 8,711,471 | B2 | 4/2014 | Liu et al. |
| 8,728,591 | B2 | 5/2014 | Inada et al. |
| 8,755,660 | B1 | 6/2014 | Minelly |
| 8,781,269 | B2 | 7/2014 | Huber et al. |
| 8,809,734 | B2 | 8/2014 | Cordingley et al. |
| 8,835,804 | B2 | 9/2014 | Farmer et al. |
| 8,947,768 | B2 | 2/2015 | Kliner et al. |
| 8,953,914 | B2 | 2/2015 | Genier |
| 9,014,220 | B2 * | 4/2015 | Minelly et al. ............... 372/6 |
| 9,136,663 | B2 | 9/2015 | Taya |
| 9,140,873 | B2 | 9/2015 | Minelly |
| 9,158,066 | B2 | 10/2015 | Fini et al. |
| 9,207,395 | B2 | 12/2015 | Fini et al. |
| 9,217,825 | B2 | 12/2015 | Ye et al. |
| 9,250,390 | B2 | 2/2016 | Muendel et al. |
| 9,310,560 | B2 | 4/2016 | Chann et al. |
| 9,322,989 | B2 | 4/2016 | Fini et al. |
| 9,325,151 | B1 | 4/2016 | Fini et al. |
| 9,339,890 | B2 | 5/2016 | Woods et al. |
| 9,366,887 | B2 | 6/2016 | Tayebati et al. |
| 9,397,466 | B2 | 7/2016 | McComb et al. |
| 9,431,786 | B2 | 8/2016 | Savage-Leuchs |
| 9,442,252 | B2 | 9/2016 | Genier |
| 9,507,084 | B2 | 11/2016 | Fini et al. |
| 9,547,121 | B2 | 1/2017 | Hou et al. |
| 9,634,462 | B2 | 4/2017 | Kliner et al. |
| 9,837,783 | B2 | 12/2017 | Kliner et al. |
| 2002/0146202 | A1 | 10/2002 | Reed et al. |
| 2003/0095578 | A1 | 5/2003 | Kopp et al. |
| 2003/0118305 | A1 | 6/2003 | Reed et al. |
| 2003/0219208 | A1 | 11/2003 | Kwon et al. |
| 2004/0208464 | A1 | 10/2004 | Po |
| 2005/0041697 | A1 | 2/2005 | Seifert et al. |
| 2005/0185892 | A1 | 8/2005 | Kwon et al. |
| 2005/0265678 | A1 | 12/2005 | Manyam et al. |
| 2006/0024001 | A1 | 2/2006 | Kobayashi |
| 2006/0067632 | A1 | 3/2006 | Broeng et al. |
| 2006/0219673 | A1 | 10/2006 | Varnham et al. |
| 2006/0291788 | A1 | 12/2006 | Po |
| 2007/0104438 | A1 | 5/2007 | Varnham |
| 2007/0147751 | A1 | 6/2007 | Fini |
| 2007/0178674 | A1 | 8/2007 | Imai et al. |
| 2007/0195850 | A1 | 8/2007 | Schluter et al. |
| 2009/0034059 | A1 | 2/2009 | Fini |
| 2009/0059353 | A1 | 3/2009 | Fini |
| 2009/0080835 | A1 | 3/2009 | Frith |
| 2009/0152247 | A1 | 6/2009 | Jennings et al. |
| 2010/0067013 | A1 | 3/2010 | Howieson et al. |
| 2010/0129029 | A1 | 5/2010 | Westbrook |
| 2010/0150186 | A1 * | 6/2010 | Mizuuchi ............ H01S 3/09415 372/21 |
| 2011/0091155 | A1 * | 4/2011 | Yilmaz et al. ............... 385/30 |
| 2011/0163077 | A1 | 7/2011 | Partlo et al. |
| 2011/0248005 | A1 | 10/2011 | Briand et al. |
| 2011/0305256 | A1 * | 12/2011 | Chann ............ G02B 27/0905 372/75 |
| 2012/0002919 | A1 | 1/2012 | Liu |
| 2012/0051692 | A1 | 3/2012 | Seo |
| 2012/0168411 | A1 | 7/2012 | Farmer et al. |
| 2012/0262781 | A1 | 10/2012 | Price et al. |
| 2013/0038923 | A1 | 2/2013 | Jespersen et al. |
| 2013/0148925 | A1 | 6/2013 | Muendel et al. |
| 2013/0223792 | A1 | 8/2013 | Huber et al. |
| 2013/0251324 | A1 | 9/2013 | Fini et al. |
| 2013/0343703 | A1 | 12/2013 | Genier |
| 2014/0086526 | A1 | 3/2014 | Starodubov et al. |
| 2014/0177038 | A1 | 6/2014 | Rrataj et al. |
| 2014/0178023 | A1 | 6/2014 | Oh et al. |
| 2014/0233900 | A1 | 8/2014 | Hugonnot et al. |
| 2014/0268310 | A1 | 9/2014 | Ye et al. |
| 2014/0334788 | A1 | 11/2014 | Fini et al. |
| 2015/0049987 | A1 | 2/2015 | Grasso et al. |
| 2015/0104139 | A1 | 4/2015 | Brunet et al. |
| 2015/0125114 | A1 | 5/2015 | Genier |

(56) References Cited

U.S. PATENT DOCUMENTS

| | | |
|---|---|---|
| 2015/0125115 A1 | 5/2015 | Genier |
| 2015/0138630 A1 | 5/2015 | Honea et al. |
| 2015/0293300 A1 | 10/2015 | Fini et al. |
| 2015/0293306 A1 | 10/2015 | Huber et al. |
| 2015/0316716 A1 | 11/2015 | Fini et al. |
| 2016/0013607 A1 | 1/2016 | McComb et al. |
| 2016/0097903 A1 | 4/2016 | Li et al. |
| 2016/0116679 A1 | 4/2016 | Muendel et al. |
| 2016/0218476 A1 | 7/2016 | Kliner et al. |
| 2016/0285227 A1 | 9/2016 | Farrow et al. |
| 2016/0320565 A1 | 11/2016 | Brown et al. |
| 2016/0320685 A1 | 11/2016 | Tayebati et al. |
| 2017/0090119 A1 | 3/2017 | Logan et al. |
| 2017/0110845 A1 | 4/2017 | Hou et al. |
| 2017/0162999 A1 | 6/2017 | Saracco et al. |
| 2017/0271837 A1 | 9/2017 | Hemenway et al. |
| 2017/0336580 A1 | 11/2017 | Tayebati et al. |

FOREIGN PATENT DOCUMENTS

| | | |
|---|---|---|
| EP | 1266259 | 5/2011 |
| WO | WO 2004/027477 | 4/2004 |
| WO | WO 2013/090236 | 6/2013 |
| WO | WO 2017/008022 | 1/2017 |

OTHER PUBLICATIONS

"Triple Clad Ytterbium-Doped Polarization Maintaining Fibers," nuFERN Driven Light Specifications, 1 page. (Jan. 2006). to.

Varshney et al., "Design of a flat field fiber with very small dispersion slope", *Optical Fiber Technology*, 9(3):189-198 (Oct. 2003).

International Search Report and Written Opinion for related International Application No. PCT/US2016/041526, 6 pages, dated Oct. 20, 2016.

International Search Report and Written Opinion for related International Application No. PCT/US2016/053807, 6 pages, dated Jan. 19, 2017.

Office Action for related U.S. Appl. No. 15/074,838, 12 pages, dated May 19, 2017.

Adelman et al., "Measurement of Relative State-to-State Rate Constants for the Reaction D + $H_2(v, j)$ → $HD(v', j')$ + H," *J. Chem. Phys.*, 97:7323-7341 (Nov. 15, 1992).

Alfano et al., "Photodissociation and Recombination Dynamics of $I_2$ in Solution," *Ultrafast Phenomena VIII*, (Springer-Verlag, New York), pp. 653-655 (Jan. 1993).

"ARM," Coherent, available at: http://www.corelase.fi/products/arm/, 6 pages, retrieved May 26, 2017.

Bernasconi et al., "Kinetics of Ionization of Nitromethane and Phenylnitromethane by Amines and Carboxylate Ions in Me2SO-Water Mixtures. Evidence of Ammonium Ion-Nitronate Ion Hydrogen Bonded Complex Formation in Me2SO-Rich Solvent Mixtures," *J. Org. Chem.*, 53:3342-3351 (Jul. 1988).

Blake et al., "The H + D2 Reaction: HD(v=1, J) and HD(v=2, J) Distributions at a Collision Energy of 1.3 eV," *Chem. Phys. Lett.*, 153:365-370 (Dec. 23, 1988).

Daniel et al., "Novel technique for mode selection in a large-mode-area fiber laser," Conference on Lasers and Electro-Optics 2010, OSA Technical Digest (CD) (Optical Society of America), paper Cwcs, 2 pages. (Jan. 2010).

Daniel et al., "Novel technique for mode selection in a multimode fiber laser," Optics Express, 19:12434-12439 (Jun. 20, 2011).

Di Teodoro et al., "Diffraction-Limited, 300-kW Peak-Power Pulses from a Coiled Multimode Fiber Amplifier," *Optics Letters*, 27:518-520 (May 2002).

Di Teodoro et al., "Diffraction-limited, 300-kW-peak-power Pulses from a Yb-doped Fiber Amplifier," Conference on Lasers and Electro-Optics, OSA Technical Digest (Optical Society of America, Washington, DC), p. 592-593 (May 22-24, 2002).

Di Teodoro et al., "High-peak-power pulsed fiber sources," *Proc. of SPIE*, 5448:561-571 (Sep. 20, 2004).

"Efficient and Simple Precision, Laser Processing Head PDT-B," HIGHYAG, 6 pages, (Jan. 2010).

"ENSIS Series," Amada America, Inc., available at: http://www.amada.com/america/ensis-3015-aj, 2 pages, retrieved May 26, 2017.

"EX-F Series," MC Machinery Systems, Inc., available at: https://www.mcmachinery.com/products-and-solutions/ex-f-series/, 2 pages, retrieved May 26, 2017.

Farrow et al., "Bend-Loss Filtered, Large-Mode-Area Fiber Amplifiers: Experiments and Modeling," Proceedings of the Solid State and Diode Laser Technology Review (Directed Energy Professional Society), P-9, 5 pages (2006).

Farrow et al., "Compact Fiber Lasers for Efficient High-Power Generation," *Proc. of SPIE*, 6287:62870C-1-62870C-6 (Sep. 1, 2006).

Farrow et al., "Design of Refractive-Index and Rare-Earth-Dopant Distributions for Large-Mode-Area Fibers Used in Coiled High-Power Amplifiers," *Proc. of SPIE*, 6453:645310-1-64531C-11 (Feb. 2, 2007).

Farrow et al., "High-Peak-Power (>1.2 MW) Pulsed Fiber Amplifier," *Proc. of the SPIE*, 6102:61020L-1-61020L-11 (Mar. 2006).

Farrow et al., "Numerical Modeling of Self-Focusing Beams in Fiber Amplifiers," *Proc. of the SPIE*, 6453:645309-1-645309-9 (2007).

Farrow et al., "Peak-Power Limits on Pulsed Fiber Amplifiers Imposed by Self-Focusing," *Optics Lett.*, 31:3423-3425 (Dec. 1, 2006).

Fève et al., "Four-wave mixing in nanosecond pulsed fiber amplifiers," Optics Express, 15:4647-4662 (Apr. 16, 2007).

Fève et al., "Limiting Effects of Four-Wave Mixing in High-Power Pulsed Fiber Amplifiers," *Proc. of the SPIE*, 6453:64531P-1-64531P-11 (Feb. 22, 2007).

Final Office action from U.S. Appl. No. 15/607,411, dated Feb. 1, 2018, 27 pages.

Fini, "Bend-compensated design of large-mode-area fibers," Optics Letters, 31:1963-1965 (Jul. 1, 2006).

Fini, "Large mode area fibers with asymmetric bend compensation," Optics Express, 19:21868-21873 (Oct. 24, 2011).

Fini et al., "Bend-compensated large-mode-area fibers: achieving robust single-modedness with transformation optics," Optics Express, 21:19173-19179 (Aug. 12, 2013).

Fox et al., "Effect of low-earth orbit space on radiation-induced absorption in rare-earth-doped optical fibers," J. Non-Cryst. Solids, 378:79-88 (Oct. 15, 2013).

Fox et al., "Gamma Radiation Effects in Yb-Doped Optical Fiber," *Proc. of the SPIE*, 6453:645328-1-645328-9 (Feb. 23, 2007).

Fox et al., "Gamma-Radiation-Induced Photodarkening in Unpumped Optical Fibers Doped with Rare-Earth Constituents," *IEEE Trans. on Nuclear Science*, 57:16181625 (Jun. 2010).

Fox et al., "Investigation of radiation-induced photodarkening in passive erbium-, ytterbium-, and Yb/Er co-doped optical fibers," *Proc. of the SPIE*, 6713:67130R-167130R-9 (Sep. 26, 2007).

Fox et al., "Radiation damage effects in doped fiber materials," *Proc. of the SPIE*, 6873:68731F-1-68731F-9 (Feb. 22, 2008).

Fox et al., "Spectrally Resolved Transmission Loss in Gamma Irradiated Yb-Doped Optical Fibers," *IEEE J. Quant. Electron.*, 44:581-586 (Jun. 2008).

Fox et al., "Temperature and Dose-Rate Effects in Gamma Irradiated Rare-Earth Doped Fibers," *Proc. of SPIE*, 7095:70950B-1-70950B-8 (Aug. 26, 2008).

Ghasemi et al., "Beam shaping design for coupling high power diode laser stack to fiber," Applied Optics, 50:2927-2930 (Jun. 20, 2011).

Goers et al., "Development of a Compact Gas Imaging Sensor Employing cw Fiber-Amp-Pumped PPLN OPO," *Conference on Lasers and Electro-Optics*, OSA Technical Digest (Optical Society of America, Washington, DC), p. 521 (May 11, 2001).

Goldberg et al., "Deep UV Generation by Frequency Tripling and Quadrupling of a High-Power Modelocked Semiconductor Laser," Proceedings of the Quantum Electronics and Laser Science Conference, QPD18-2 (Baltimore) 2 pages (May 1995).

(56) References Cited

OTHER PUBLICATIONS

Goldberg et al., "Deep UV Generation by Frequency Quadrupling of a High-Power GaAlAs Semiconductor Laser," *Optics Lett.*, 20:1145-1147 (May 15, 1995).
Goldberg et al., "High Efficiency 3 W Side-Pumped Yb Fiber Amplifier and Laser," *Conference on Lasers and Electro-Optics*, OSA Technical Digest (Optical Society of America, Washington, DC), p. 11-12 (May 24, 1999).
Goldberg et al., "Highly Efficient 4-W Yb-Doped Fiber Amplifier Pumped by a Broad-Stripe Laser Diode," *Optics Lett.*, 24:673-675 (May 15, 1999).
Goldberg et al., "High-Power Superfluorescent Source with a Side-Pumped Yb-Doped Double-Cladding Fiber," *Optics Letters*, 23:1037-1039 (Jul. 1, 1998).
Goldberg et al., "Tunable UV Generation at 286 nm by Frequency Tripling of a High-Power Modelocked Semiconductor Laser," *Optics Lett.*, 20:1640-1642 (Aug. 1, 1995).
Golub, "Laser Beam Splitting by Diffractive Optics," *Optics and Photonics News*, 6 pages. (Feb. 2004).
Han et al., "Reshaping collimated laser beams with Gaussian profile to uniform profiles," *Applied Optics*, 22:3644-3647 (Nov. 15, 1983).
Headrick et al., "Application of laser photofragmentation-resonance enhanced multiphoton ionization to ion mobility spectrometry," *Applied Optics*, 49:2204-2214 (Apr. 10, 2010).
Hemenway et al., "Advances in high-brightness fiber-coupled laser modules for pumping multi-kW CW fiber lasers," Proceedings of SPIE, 10086:1008605-11008605-7 (Feb. 22, 2017).
Hemenway et al.," High-brightness, fiber-coupled pump modules in fiber laser applications," Proc. of SPIE, 8961:89611V-1-89611V-12 (Mar. 7, 2014).
Hoops et al., "Detection of mercuric chloride by photofragment emission using a frequency-converted fiber amplifier," *Applied Optics*, 46:4008-4014 (Jul. 1, 2007).
Hotoleanu et al., "High Order Mode Suppression in Large Mode Area Active Fibers by Controlling the Radial Distribution of the Rare Earth Dopant," Proc. of the SPIE, 6102:61021T-1-61021T-8 (Feb. 23, 2006).
"How to Select a Beamsplitter," IDEX—Optics & Photonics Marketplace, available at: https://www.cvilaseroptics.com/file/general/beamSplitters.pdf, 5 pages (Jan. 8, 2014).
Huang et al., "Double-cutting beam shaping technique for high-power diode laser area light source," *Optical Engineering*, 52:106108-1-106108-6 (Oct. 2013).
International Search Report and Written Opinion from International Application No. PCT/US2017/034848, dated Nov. 28, 2017, 15 pages.
Ishiguro et al., "High Efficiency 4-kW Fiber Laser Cutting Machine," *Rev. Laser Eng.*, 39:680-684 (May 21, 2011).
Johnson et al., "Experimental and Theoretical Study of Inhomogeneous Electron Transfer in Betaine: Comparisons of Measured and Predicted Spectral Dynamics," *Chem. Phys.*, 176:555-574 (Oct. 15, 1993).
Johnson et al., "Ultrafast Experiments on the Role of Vibrational Modes in Electron Transfer," *Pure and Applied Chem.*, 64:1219-1224 (May 1992).
Kliner, "Novel, High-Brightness, Fibre Laser Platform for kW Materials Processing Applications," 2015 European Conference on Lasers and Electro-Optics—European Quantum Electronics Conference (Optical Society of America, 2015), paper Cj 11 2, 1 page (Jun. 21-25, 2015).
Kliner et al., "4-kW fiber laser for metal cutting and welding," Proc. of SPIE, 7914:791418-791418-8 (Feb. 22, 2011).
Kliner et al., "Comparison of Experimental and Theoretical Absolute Rates for Intervalence Electron Transfer," *J. Am. Chem. Soc.*, 114:8323-8325 (Oct. 7, 1992).
Kliner et al., "Comparison of Experimental and Theoretical Integral Cross Sections for $D + H_2(v=1, j=1) \rightarrow HD(v'=1, j') + H$," *J. Chem. Phys.*, 95:1648-1662 (Aug. 1, 1991).
Kliner et al., "$D + H_2(v=1, J=1)$: Rovibronic State to Rovibronic State Reaction Dynamics," *J. Chem. Phys.*, 92:2107-2109 (Feb. 1, 1990).
Kliner et al. "Effect of Indistinguishable Nuclei on Product Rotational Distributions: $H + HI \rightarrow H_2 + HI\ reactions_a$)," *J. Chem. Phys.*, 90:4625-4327 (Apr. 15, 1989).
Kliner et al., "Efficient second, third, fourth, and fifth harmonic generation of a Yb-doped fiber amplifier," *Optics Communications*, 210:393-398 (Sep. 15, 2002).
Kliner et al., "Efficient UV and Visible Generation Using a Pulsed Yb-Doped Fiber Amplifier," *Conference on Lasers and Electro-Optics*, OSA Technical Digest (Optical Society of America, Washington, DC), p. CPDC10-1-CPDC10-3 (May 19-22, 2002).
Kliner et al., "Efficient visible and UV generation by frequency conversion of a mode-filtered fiber amplifier," *Proc. of SPIE*, 4974:230-235 (Jul. 3, 2003).
Kliner et al., "Fiber laser allows processing of highly reflective materials," *Industrial Laser Solutions*, 31:1-9 (Mar. 16, 2016).
Kliner et al., "High-Power Fiber Lasers," *Photonics & Imaging Technology*, pp. 2-5 (Mar. 2017).
Kliner et al., "Laboratory Investigation of the Catalytic Reduction Technique for Detection of Atmospheric $NO_y$," *J. Geophys. Res.*, 102:10759-10776 (May 20, 1997).
Kliner et al., "Laser Reflections: How fiber laser users are successfully processing highly reflective metals," Shop Floor Lasers, available at: http://www.shopfloorlasers.com/laser-cutting/fiber/354-laser-reflections, 9 pages (Jan./Feb. 2017).
Kliner et al., "Measurements of Ground-State OH Rotational Energy-Transfer Rates," *J. Chem. Phys.*, 110:412-422 (Jan. 1, 1999).
Kliner et al., "Mode-Filtered Fiber Amplifier," Sandia National Laboratories—Brochure, 44 pages (Sep. 13, 2007).
Kliner et al., "Narrow-Band, Tunable, Semiconductor-Laser-Based Source for Deep-UV Absorption Spectroscopy," *Optics Letters*, 22:1418 -1420 (Sep. 15, 1997).
Kliner et al., "Overview of Sandia's fiber laser program," Proceedings of SPIE—The International Society for Optical Engineering, 6952:695202-1-695202-12 (Apr. 14, 2008).
Kliner et al., "Photodissociation and Vibrational Relaxation of $I_2$ in Ethanol," *J. Chem. Phys.*, 98:5375-5389 (Apr. 1, 1993).
Kliner et al., "Photodissociation Dynamics of $I_2$ in Solution," Ultrafast Reaction Dynamics and Solvent Effects, (American Institute of Physics, New York), pp. 16-35 (Feb. 1994).
Kliner et al., "Polarization-Maintaining Amplifier Employing Double-Clad, Bow-Tie Fiber," *Optics Lett.*, 26:184-186 (Feb. 15, 2001).
Kliner et al., "Power Scaling of Diffraction-Limited Fiber Sources," *Proc. of SPIE*, 5647:550-556 (Feb. 21, 2005).
Kliner et al., "Power Scaling of Rare-Earth-Doped Fiber Sources," *Proc. of SPIE*, 5653:257-261 (Jan. 12, 2005).
Kliner et al., "Product Internal-State Distribution for the Reaction $H + HI \rightarrow H_2 + I$," *J. Chem. Phys.*, 95:1663-1670 (Aug. 1, 1991).
Kliner et al., "The $D + H_2$ Reaction: Comparison of Experiment with Quantum-Mechanical and Quasiclassical Calculations," *Chem. Phys. Lett.*, 166:107-111 (Feb. 16, 1990).
Kliner et al., "The $H+para-H_2$ reaction: Influence of dynamical resonances on $H_2(v' = 1, j' = 1$ and 3) Integral Cross Sections," *J. Chem. Phys.*, 94:1069-1080 (Jan. 15, 1991).
Koplow et al., "A New Method for Side Pumping of Double-Clad Fiber Sources," *J. Quantum Electronics*, 39:529-540 (Apr. 4, 2003).
Koplow et al., "Compact 1-W Yb-Doped Double-Cladding Fiber Amplifier Using V-Groove Side-Pumping," *IEEE Photonics Technol. Lett.*, 10:793-795 (Jun. 1998).
Koplow et al., "Development of a Narrowband, Tunable, Frequency-Quadrupled Diode Laser for UV Absorption Spectroscopy," *Appl. Optics*, 37:3954-3960 (Jun. 20, 1998).
Koplow et al., "Diode-Bar Side-Pumping of Double-Clad Fibers," Proceedings of the Solid State and Diode Laser Technology Review (Directed Energy Professional Society) (Apr. 22, 2005).
Koplow et al., "Diode-Bar Side-Pumping of Double-Clad Fibers," *Proc. of SPIE*, 5709:284-300 (Apr. 22, 2005).

(56) References Cited

OTHER PUBLICATIONS

Koplow et al., "High Power PM Fiber Amplifier and Broadband Source," *Optical Fiber Communication Conference*, OSA Technical Digest (Optical Society of America, Washington, DC), p. 12-13 (Mar. 7-10, 2000).
Koplow et al., "Polarization-Maintaining, Double-Clad Fiber Amplifier Employing Externally Applied Stress-Induced Birefringence," *Optics Lett.*, 25:387-389 (Mar. 15, 2000).
Koplow et al., "Single-mode operation of a coiled multimode fiber amplifier," Optics Letters, 25:442-444 (Apr. 1, 2000).
Koplow et al., "Use of Bend Loss to Obtain Single-Transverse-Mode Operation of a Multimode Fiber Amplifier," *Conference on Lasers and Electro-Optics*, OSA Technical Digest (Optical Society of America, Washington, DC), p. 286-287 (May 7-12, 2000).
Koplow et al., "UV Generation by Frequency Quadrupling of a Yb-Doped Fiber Amplifier," *IEEE Photonics Technol. Lett.*, 10:75-77 (Jan. 1998).
Koponen et al., "Photodarkening Measurements in Large-Mode-Area Fibers," *Proc. of SPIE*, 6453:64531E-1-64531E-12 (Feb. 2007).
Kotlyar et al., "Asymmetric Bessel-Gauss beams," J. Opt. Soc. Am. A, 31:1977-1983 (Sep. 2014).
Kulp et al., "The application of quasi-phase-matched parametric light sources to practical infrared chemical sensing systems,"*Appl. Phys. B*, 75:317-327 (Jun. 6, 2002).
"Laser cutting machines," TRUMPF, available at: http://www.us.trumpf.com/en/products/machine-tools/products/2d-laser-cutting/innovative-technology/brightline.html, 9 pages, retrieved May 26, 2017.
Longhi et al., "Self-focusing and nonlinear periodic beams in parabolic index optical fibres," J. Opt. B: Quantum Semiclass. Opt., 6:S303-S308 (May 2004).
Maechling et al., "Sum Frequency Spectra in the C-H Stretch Region of Adsorbates on Iron,"Appl. Spectrosc., 47:167-172 (Feb. 1, 1993).
McComb et al., "Pulsed Yb:fiber system capable of >250 kW peak power with tunable pulses in the 50 ps to 1.5 ns. range," *Proc. of SPIE*, 8601:86012T-1-86012T11 (Mar. 23, 2013).
Moore et al., "Diode-bar side pumping of double-clad fibers," *Proc. of SPIE*; , 6453:64530K-1-64530K-9 (Feb. 20, 2007).
Neuhauser et al., "State-to-State Rates for the D + $H_2(v = 1, j = 1)$ → HD(v', j') + H Reaction: Predictions and Measurements," Science, 257:519-522 (Jul. 24, 1992).
Office action from U.S. Appl. No. 15/607,399, dated Sep. 20, 2017, 25 pages.
Office action from U.S. Appl. No. 15/607,411, dated Sep. 26, 2017, 15 pages.
Office action from U.S. Appl. No. 15/607,410, dated Oct. 3, 2017, 32 pages.
Price et al., "High-brightness fiber-coupled pump laser development," *Proc. of SPIE*, 7583:758308-1-758308-7 (Feb. 2010).
Rinnen et al., "Construction of a Shuttered Time-of-Flight Mass Spectrometer for Selective Ion Detection," *Rev. Sci. Instrum.*, 60:717-719 (Apr. 1989).
Rinnen et al., "Effect of Indistinguishable Nuclei on Product Rotational Distributions: D + DI → $D_2$ + I," *Chem. Phys. Lett.*, 169:365-371 (Jun. 15, 1990).
Rinnen et al. "Quantitative Determination of HD Internal State Distributions via (2+1) REMPI," *Isr. J. Chem.*, 29:369-382 (Mar. 7, 1989).
Rinnen et al., "Quantitative determination of $H_2$, HD, and $D_2$ internal state distributions via (2+1) resonance-enhanced multiphoton ionization," *J. Chem. Phys.*, 95:214-225 (Jul. 1, 1991).
Rinnen et al., "The H + $D_2$ Reaction: "Prompt" HD Distributions at High Collision Energies," *Chem. Phys. Lett.*, 153:371-375 (Dec. 23, 1988).
Rinnen et al., "The H + $D_2$ Reaction: Quantum State Distributions at Collision Energies of 1.3 and 0.55 eV," *J. Chem. Phys.*, 91:7514-7529 (Dec. 15, 1989).
Romero et al., "Lossless laser beam shaping," *J. Opt. Soc. Am. A*, 13:751-760 (Apr. 1996).
Sanchez-Rubio et al., "Wavelength Beam Combining for Power and Brightness Scaling of Laser Systems," *Lincoln Laboratory Journal*, 20:52-66 (Aug. 2014).
Saracco et al., "Compact, 17 W average power, 100 kW peak power, nanosecond fiber laser system," *Proc. of SPIE*, 8601:86012U-1-86012U-13 (Mar. 22, 2013).
Schrader et al., "Fiber-Based Laser with Tunable Repetition Rate, Fixed Pulse Duration, and Multiple Wavelength Output," *Proc. of the SPIE*, 6453:64530D-164530D-9 (Feb. 20, 2007).
Schrader et al., "High-Power Fiber Amplifier with Widely Tunable Repetition Rate, Fixed Pulse Duration, and Multiple Output Wavelengths," *Optics Express*, 14:11528-11538 (Nov. 27, 2006).
Schrader et al., "Power scaling of fiber-based amplifiers seeded with microchip lasers," *Proc. of the SPIE*, 6871:68710T-1-68710T-11 (Feb. 2008).
Sheehan et al., "Faserlaser zur Bearbeitung hochreflektierender Materialien (Fiber laser processing of highly reflective materials)," *Laser*, 3:92-94 (Jun. 2017).
Sheehan et al. "High-brightness fiber laser advances remote laser processing," *Industrial Laser Solutions*, 31:1-9 (Nov. 2, 2016).
Sun et al., "Optical Surface Transformation: Changing the optical surface by homogeneous optic-null medium at will," *Scientific Reports*, 5:16032-1-16032-20 (Oct. 30, 2015).
Tominaga et al., "Femtosecond Experiments and Absolute Rate Calculations on Intervalence Electron Transfer in Mixed-Valence Compounds," *J. Chem. Phys.*, 98:1228-1243 (Jan. 15, 1993).
Tominaga et al., "Ultrafast Studies of Intervalence Charge Transfer," *Ultrafast Phenomena VIII*, (Springer-Verlag, New York), pp. 582- 584 (1993).
Xiao et al., "Fiber coupler for mode selection and high-efficiency pump coupling," Optics Letters, 38:1170-1172 (Apr. 1, 2013).
Yaney et al., "Distributed-Feedback Dye Laser for Picosecond UV and Visible Spectroscopy," *Rev. Sci. Instrum*, 71:1296-1305 (Mar. 2000).
Yu et al., "1.2-kW single-mode fiber laser based on 100-W high-brightness pump diodes," *Proc. of SPIE*, 8237:82370G-1-82370G-7 (Feb. 16, 2012).

\* cited by examiner

SCALABLE HIGH POWER FIBER LASER

BACKGROUND OF THE INVENTION

1. Field of the Invention

Generally, the field of the present invention is high power fiber lasers. More particularly, the present invention relates to scalable high power continuous-wave and quasi-continuous-wave fiber lasers.

2. Background

Conventional multi-kilowatt industrial fiber laser systems typically employ a non-scalable architecture consisting of multiple component fiber lasers whose outputs are combined with a fused-fiber signal combiner. The total fiber laser system output power is typically in the range of 2 to 6 kW, and the individual component fiber lasers typically have a power in the range of 0.4 to 1.0 kW. Thus, in order to reach total powers in excess of 1 kW, the outputs from multiple fiber lasers (typically two to ten) must be combined.

Such conventional approaches for achieving a high power fiber laser output have several drawbacks made apparent in light of the present disclosure. For example, by combining the multiple individual fiber laser systems significant redundancy is required in optical, electrical, and mechanical components, thereby increasing the system cost, size, and complexity. In addition, fiber laser component systems generally have limited field serviceability, often requiring replacement of the entire fiber laser component system if an optical component thereof fails. Such entire replacement occurs even when the optical component failure is localized to only a portion of the fiber component system, such as a broken fiber. Requiring the replacement of entire fiber laser component systems increases cost for repair of the complete multi-kilowatt system. Field replacement of a fiber laser component system typically requires highly specialized equipment and clean-room conditions, which are not readily available in factory environments, making service costly and disruptive.

The fused-fiber signal combiner causes optical loss and diminishes the beam quality of the individual fiber laser outputs received. This loss negatively impacts efficiency, which determines power consumption and waste-heat generation, and beam quality degradation can reduce the speed in metal-cutting applications. Furthermore, the signal combiner is expensive, requiring costly equipment and considerable process development and control for fabrication, and it can experience unpredictable variation impacting reproducibility and reliability. Fused-fiber signal combiners are also subject to operational damage, including from optical feedback from the work piece, thereby decreasing system reliability.

Utilizing a signal combiner to achieve up to a few kilowatts of power also limits the ability for laser power of the fiber laser system to be upgraded in the field. For example, a fused signal combiner may include empty ports for receiving additional component fiber lasers. However, the beam quality of output beam is degraded whether or not the extra ports are populated with additional component fiber laser system outputs. Also, if the signal combiner has fully populated input ports, upgrading system output power requires the replacement of one or more of the component fiber lasers with a component fiber laser of higher power. Replacing component fiber lasers is expensive, particularly since there is attendant with it limited or no re-use of the replaced component fiber laser, subsystems, or components.

Conventional system designs are also limited with respect to how technological advances can be accommodated or incorporated since many key components are integrated into each component fiber laser. For example, pump diode technology is advancing rapidly, providing increased power, brightness, and efficiency and reduced cost. Active fibers have also experienced significant technological gains in recent years. Incorporating these advances into an existing fiber laser can be difficult or impossible if the pump diodes, fibers, and electronics are all integrated into a single laser module. For example, the interconnections among components within a single laser module would likely be inaccessible or not easily changeable, and changes to critical components would entail significant design ripple, requiring corresponding changes in the other components. Similarly, the mechanical or thermal designs could be impacted by changing a critical component. Thus, conventional high power fiber laser architectures often must either forgo upgrades based on technological advances or commit to costly and time consuming redesign.

A need therefore exists for a multi-kilowatt fiber laser architecture that minimizes cost by eliminating component redundancy, minimizes or eliminates the drawbacks of signal combiners, is easily and cost-effectively serviceable in the field, enables field upgradability, and is sufficiently flexible to accommodate technological advances without significant cost or design ripple.

SUMMARY OF THE INVENTION

According to one aspect of the present invention, a modular and scalable high power fiber laser system configurable to generate 1 kW or more of laser output includes one or more separable pump modules separately disposed from each other, each pump module including a plurality of fiber-coupled component pump sources optically combined by one or more fiber-based pump module pump combiners, each pump module providing one or more pump module fiber outputs, and a gain module separately disposed from the one or more separable pump modules and including one or more gain module pump fiber inputs optically coupled to corresponding ones of the pump module fiber outputs, and including a gain fiber optically coupled to the one or more gain module pump fiber inputs, the gain fiber configured to generate a gain module fiber output power scalable in relation to the number and power of the pump module fiber outputs coupled to the gain fiber.

According to another aspect of the present invention, a high-power fiber laser system includes a gain module configured to generate an output beam of 1 kW or greater at an output beam wavelength, and one or more pump modules optically coupled to the gain module and configured to generate light at a pump wavelength for optically pumping the gain module, wherein the gain module is configured to receive pump light from the one or more pump modules such that the power of the output beam is scalable in accordance with the number and power of pump modules coupled to the gain module.

The foregoing and other objects, features, and advantages will become apparent from the following detailed description, which proceeds with reference to the accompanying figures which are not necessarily to scale.

DETAILED DESCRIPTION OF THE INVENTION

Figure 1A:
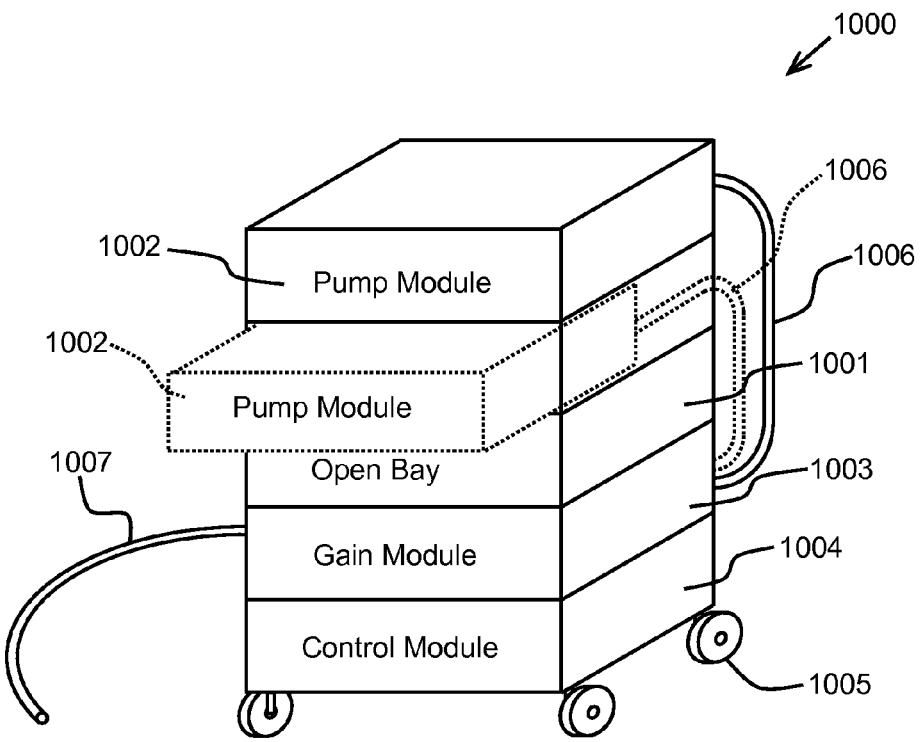
FIG. 1A is a perspective view of a fiber laser system in accordance with an aspect of the present invention.

A perspective view of a first embodiment of a highly configurable, modular, and scalable continuous-wave or quasi-continuous-wave high-power fiber laser system 1000 is shown in FIG. 1A. The fiber laser system 1000 includes several bays 1001 which modularly receive different system modules, including system pump modules 1002 and system gain modules 1003, each which can be configured to be separable from the fiber laser system 1000. Additional modules, such as a control module 1004 or a power supply module, also can be modularly disposed in relation to the other system modules of the system 1000. The scalable multi-kilowatt fiber laser system 1000 is depicted in an optional mobile configuration, with a plurality of system modules disposed in a vertical rack arrangement mounted atop a plurality of casters 1005 for convenient movement in an industrial environment. Pump modules 1002 provide one or more pump module fiber outputs 1006 which are optically coupled to one or more gain modules 1003. Fiber laser system 1000 includes a system output 1007 providing about 1 kW or more of output power for various industrial applications and which can be provided by the one or more gain modules 1003. Output power of the system can be scaled by adding additional pump modules 1002 in available system bays 1001 or by upgrading installed pump modules 1002 by swapping old with new.

The modularity and scalability of embodiments herein present numerous manufacturing advantages. For example, many different power levels can be selected without requiring significant redesign between the selected power level configurations. A configuration with a single pump module 1002 and a single gain module 1003 can provide a particular system output power which can be upgraded by installing an additional pump module 1002 (see pump module 1002 shown in dashed lines in FIG. 1) and splicing the pump module output 1006 to the gain module 1003. Due to the modularity, size and weight can be divided between pump and gain modules such that a single person in the field or factory can carry, implement, or service each pump and gain module of the system. This advantage can be particularly significant as the power from a single fiber laser is increased, which has been a consistent trend in the industry; this power scaling trend can continue without resulting in prohibitively large or heavy modules because the pump modules and gain modules do not have to be housed in a single module. The form factor of the laser system can also be configured to support different deployment scenarios. For example, system modules can be mounted in a rack vertically as shown in FIG. 1, horizontally, or in another orientation, or combination thereof. Modules can be physically separated from each other to facilitate integration into a desired space.

Figure 1B:
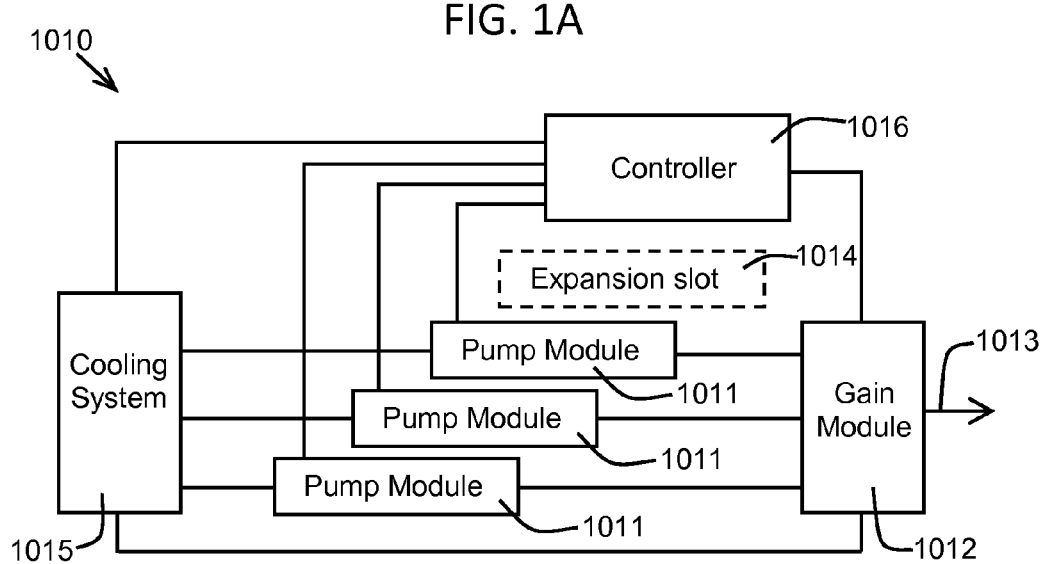
FIG. 1B is a connectivity diagram of the fiber laser system depicted in FIG. 1A in accordance with an aspect of the present invention.

In FIG. 1B a schematic is shown for an embodiment of a system 1010 similar to that shown in perspective view in FIG. 1A. The system 1010 includes a plurality of pump modules 1011 providing pump energy to a gain module 1012 which is configured to generate a laser system output 1013. The system 1010 can include one or more expansion slots 1014 to provide configuration changes to the system 1010, such as additional pump or gain modules. A cooling system 1015 is coupled to the pump and gain modules to provide thermal stability therein and to the system 1010 as a whole. The system 1010 is controlled by a controller 1015 configured to monitor and adjust outputs and other properties of the pump modules, gain modules and cooling system.

Figure 2:
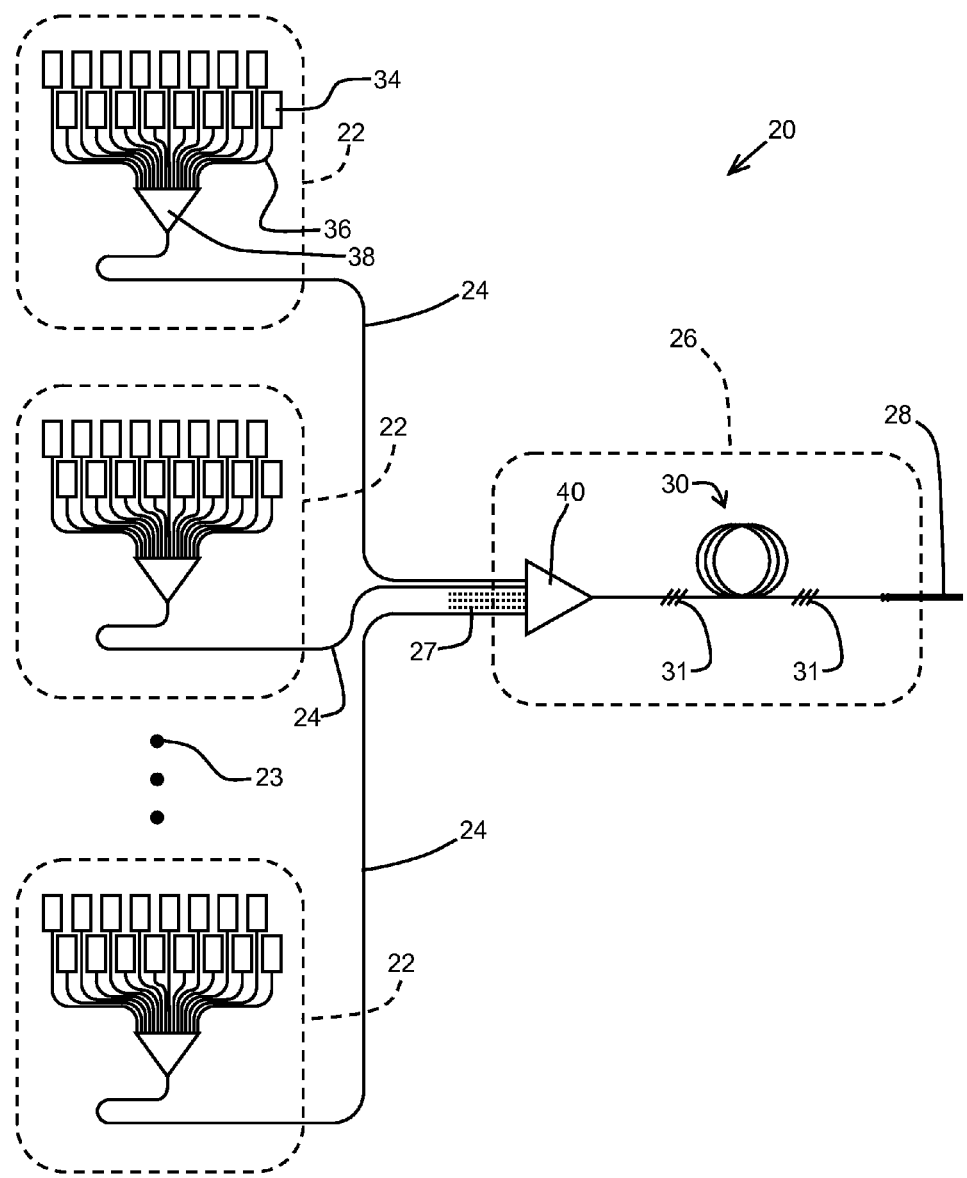
FIG. 2 is a plan view schematic of a fiber laser system in accordance with an aspect of the present invention.

Referring now to FIG. 2, an embodiment of a high power fiber laser system 20 is shown, in accordance with another aspect of the present invention. The fiber laser system 20 is highly configurable and modular such that the system 20 can be manufactured ab initio for operation at a pre-selected range of output powers, such as between 1 kW or less and multiple KWs, and for upgrade to higher output powers or different performance criteria. The fiber laser system 20 includes one or more component pump modules 22 each separately disposed from the other and modularly separable from the system 20. Each component pump module 22 provides one or more component pump module outputs 24. The fiber laser system 20 also includes one or more gain modules 26 separately disposed from each other and modularly separable from the system 20. The one or more gain modules 26 are optically coupled to the one or more component pump module outputs 24, such that a fiber laser system output beam 28 is produced at a predetermined output power. In the example shown in FIG. 2, a single gain module 26 provides the system output beam 28 by utilizing the pump power of three pump modules 22 coupled to the gain module 26. Slots for additional modularly separable pump modules 22 are shown with spots 23 while corresponding additional pump module outputs for coupling to the gain module 26 are shown with dashed lines 27.

Gain module 26 includes a gain fiber incorporated into a laser oscillator 30 providing laser oscillation between opposite fiber Bragg gratings 31. In some examples, the gain fiber of the gain module 26 includes optical fiber sized to accommodate a predetermined highest output power for the fiber laser system 20. For example, in some embodiments selected maximum operating output powers are in the kW range, such as 1 kW, 2 kW, 3 kW, 4 kW, 5 kW, or higher. The maximum output power of the fiber laser system 20 is determined by the number and output power of pump modules 22 capable of being spliced to the gain module 26. Thus, the fiber laser output beam 28 can be produced without using a plurality of redundant oscillator or amplifier systems, without redundant supporting mechanical and electrical components, and without using a signal combiner to combine a plurality of redundant component fiber laser outputs.

The separate and modular nature of the pump and gain modules 22, 26 allows each to be serviced separately. For example, if a fiber failure occurs in the gain module 26, the gain module 26 can be replaced while each of the installed pump modules remains intact without any or substantial modification. Similarly, if a pump module 22 fails in some fashion, the pump module 22 can be replaced, leaving each other pump module 22 and the gain module 26 in place without any or substantial modification thereof. Systems herein provide robustness advantages as potential failures are more likely to be isolated to particular system modules, which can be interchanged and upgraded without replacing an entire system.

In preferred examples, a pump module 22 includes one or more semiconductor diode laser modules 34 each including one or more semiconductor diode lasers providing one or more diode laser output beams combined and coupled to a diode laser module output optical fiber 36. A plurality of output optical fibers 36 are optically coupled to a pump module pump combiner 38 to combine the diode laser module pump light into a pump module output 24. Pump module pump combiners 38 are configured to transmit low-brightness multimode pump light in a large core, as opposed to signal combiners, which transmit high-brightness signal light in a small core. Pump combiners are often manufactured at less cost than signal combiners since the performance requirements, such as beam quality at the combiner output and optical insertion loss, are typically less demanding.

Combined pump light is coupled out of the pump module 22 through one or more pump module outputs 24. The pump module outputs 24 are optically coupled (e.g., by fiber splicing) to the gain module 26 onto a fiber combiner 40 thereof. The fiber combiner 40 can be the similar in design to the pump module pump combiner 38 associated with each pump module 22. However, in preferred examples, the combiner in the gain module can be a pump-signal combiner, which transmits both signal and pump light. As will be described further hereinafter, pump-signal combiners can be used at a back end of the gain module gain fiber, at a front end of the gain fiber to launch counter-propagating pump light, within or between gain stages (e.g., between an oscillator and an amplifier or between amplifiers), or some combination thereof. In various examples herein, since the performance requirements of the fiber splices between the pump and gain modules are often lower than those for splices that must transmit signal light (e.g., between a component fiber laser and a signal combiner in conventional designs), splicing requirements are relaxed concomitantly, allowing for in situ splicing of the pump module outputs 24 to selected gain module inputs of the fiber combiner 40 under less than clean-room conditions using commercially available equipment. Alignment sensitivity and cleave-angle requirements are lower for splicing outputs 24 to fiber combiner 40 as compared to the splicing of fibers to signal combiners, also contributing to the accessibility of splicing fibers to the fiber combiner 40 in a factory or other field environment. For glass-clad fibers, splicing of the pump module outputs 24 to the fiber combiner 40 is insensitive to contamination and consequently suitable for use in field and factory environments. In some examples, pump module outputs 24 are coupled to gain module 26 via connectors pluggable into the pump module or the gain module or both, eliminating the need for splicing and further enhancing modularity of the fiber laser system.

In addition to enhancing the field serviceability of the fiber laser system 20, the modular separation of the pump modules and gain module allows for field upgradability of the system 20 to higher allowable output powers. For example, additional pump modules 22 can be spliced to open pump fiber inputs of the fiber combiner 40 of the gain module. Additional pump modules 22 can be identical to or different from existing modules 22 spliced to the gain module 26 such that laser output 28 of the system 20 can be selectably scaled to higher powers. Similar to servicing an existing system 20, the procedure for splicing the pump module outputs 24 of the additional pump modules 22 to the fiber inputs of the fiber combiner 40 is relatively simple and can be performed in a factory or other field environment. The modular separation between pump modules and gain module also allows for scalable power output of the system 20 because the physical separation between pump modules and between the gain module and pump modules reduces or eliminates thermal crosstalk between modules. Each module can be provided with independent water-cooling ports such that modules can be cooled separately or cooled together in parallel or in series. In one example high power fiber laser system built in accordance with aspects of the present invention a 3 kW fiber laser output power can be generated with three 1.5 kW pump modules being spliced to the gain module. In another example, building or upgrading the fiber laser system to have three 2.0 kW pump modules can provide a 4 kW fiber laser output power. In some examples, one or more backup pump modules can be provided in the fiber laser system 20 for use in the event of the failure of another pump module. The system 20 can be configured to switch over to the backup pump modules immediately upon failure, or slowly as one or more other active pump modules degrade over a period of time. The separable nature of the pump modules further allows for failed modules to be replaced in situ with new pump modules without affecting the operation of the backup pump modules or fiber laser system.

In addition to field serviceability and field power expandability, the modularity of system 20 provides for adaptability to various technology improvements, ensuring compatibility of the system 20 and its existing modules with the pace of innovation in the laser industry. For example, improvements in pump diode technology could provide for an upgraded pump module 22. The upgraded pump module can be substituted for an existing pump module 22 or can be used in addition to existing pump modules 22, providing improved system performance, efficiency, cost, or any combination thereof, without requiring significant design changes or replacement of components that have not been upgraded. Similarly, improvements in gain module technology such as oscillator or amplifier architecture might provide for an upgraded gain module 26. The upgraded gain module can be substituted for the existing gain module 26 without requiring replacement or modification of the pump modules. The various substitutions can again be performed in the field or factory environment.

In many industrial applications for kW fiber lasers, single-mode output beam quality is not required. Accordingly, conventional architectures typically combine the outputs of fiber lasers producing single-mode signal beams using a signal combiner to produce a multimode output beam. In some examples of fiber laser system 20, the gain module 26 does not produce single-mode output since such output is not required for many applications. Because the desired output is multimode, systems 20 can achieve such output without the need for the complexity of single-mode combination. Also, because single-mode operation of the gain module 26 is not required, the ability to scale the power of the gain module 26 to multiple kW outputs is more accessible. Allowing the gain fiber of the gain module 26 to be multimode facilitates power scaling in a more practical manner than by maximizing the single-mode output power of an individual fiber laser since the single-mode power limit is lower than the multimode power limit. Single-mode fiber lasers are typically limited to a power level of around 1-2 kW, resulting in the requirement that multiple fiber lasers be combined in order to reach multiple kW power levels; approaches to scaling the single-mode power beyond this level typically entail cost, complexity, and/or inefficiency that are undesirable for an industrial laser system.

In other embodiments, a single-mode system output may be desirable, and gain module 26 can be configured for single-mode output. A single-mode gain module 26 is typically rated at a lower output power than counterpart systems with multimode outputs. However, the modularity of the architecture of the system 20 allows a multimode gain module to be swapped with a single-mode gain module. In one example, a single-mode gain module can be rated for an output of 1 kW while a multi-mode gain module can be rated for an output of 3 or 4 kW.

In typical examples of gain module 26, beam quality of the output beam 28 is generally dependent upon the maximum power rating of the gain module such that higher power ratings for gain module 26 generally correspond with a lower beam quality for output beam 28. Some particular examples of gain modules 26 can be rated at a maximum power rating higher than other particular examples of gain modules 26, and for the same output level the higher rated module will provide an output beam 28 of lower beam quality than the output beam 28 with the lower power rated module. However, in fiber laser system examples herein that do not utilize fused signal combiners such that undesirable beam quality degradation in the output beam 28 is correspondingly avoided, a higher power rated gain module 26, configured to receive multiple pump module outputs 24, is made possible. Thus, provision for receiving a plurality of pump module outputs 24 in the gain module 26 does not represent a significant beam quality compromise for system 20 configured for multiple kW power output and may provide better beam quality than a system with similar output power based on combining the outputs of single-mode fiber lasers.

Conventional kW fiber laser systems for industrial materials processing applications typically provide a beam parameter product (BPP, a standard measure of beam quality) of 2.3-3.0 mm-mrad at a power level of 2-4 kW, and the BPP is generally larger (i.e., worse beam quality) at higher powers. By eliminating the signal combiner according to various aspects of the present invention, an output with a higher beam quality is possible. For example, with presently available pump diodes, a beam quality of less than about 1 mm-mrad is possible at 2 to 3 kW and less than about 2 mm-mrad is possible at 4 to 5 kW.

Figures 3A, 3B:
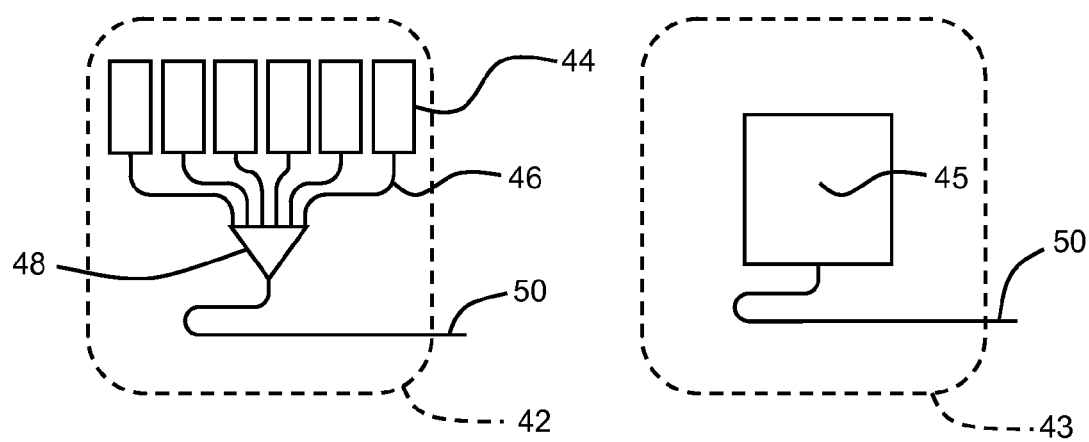
FIG. 3A is a schematic of a pump module of a fiber laser system in accordance with an aspect of the present invention.
FIG. 3B is a schematic of a pump module of a fiber laser system in accordance with an aspect of the present invention.

Modular pump modules can be provided in a variety of selectable configurations. With reference to FIG. 3A, a pump module 42 is shown that includes a plurality of semiconductor diode laser modules 44. Diode laser modules 44 are fiber-coupled such that the diode laser light generated in the laser module 44 is directed into an output optical fiber 46. The plurality of output optical fibers 46 are combined with a fused-fiber pump combiner 48. Combiners are typically made of glass and are tapered or fused to collapse multiple optical fiber inputs to fewer or one optical fiber output. The light coupled into the combiner 48 is combined and directed into a pump module output 50. Different types of diode laser modules 44 may be used, which can provide different levels of laser beam brightness or irradiance, as well as power output. Consequently, in some examples, fewer of a particular type, more of a particular type, or different types of diode laser modules 44 may be used to achieve the same desired power output of the pump module 42. With combiner 48 the plurality of output optical fibers 46 is combined in a single stage to provide a pump module output 50, which can be polymer-clad or glass-clad or both, for subsequent optical coupling to a gain module (not shown). In FIG. 3B, a pump module 43 is shown that includes a single semiconductor diode laser module 45. Diode laser module 45 provides a sufficient amount of optical pumping power for coupling into a pump module output 50 without requiring the use of a pump combiner to combine multiple diode laser modules in the pump module.

Figure 4:
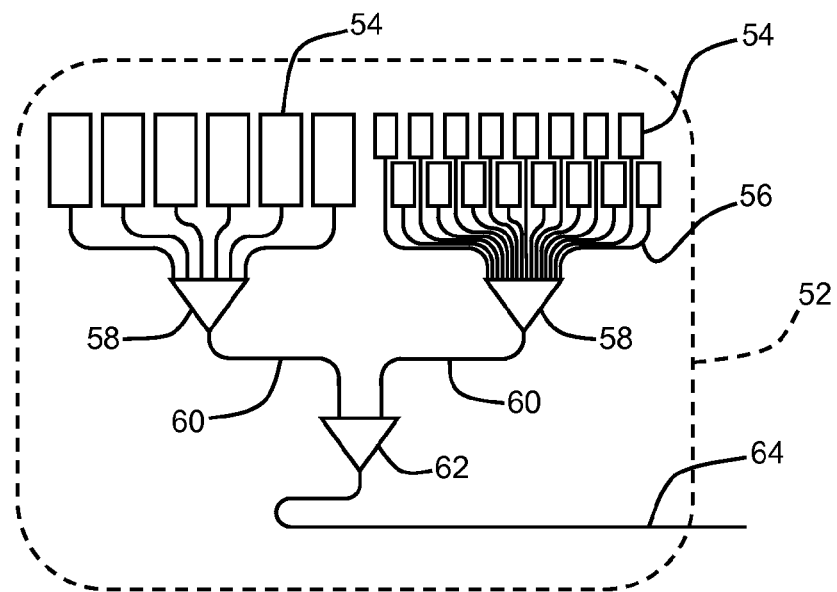
FIG. 4 is a schematic of another pump module of a fiber laser system in accordance with an aspect of the present invention.

Referring to FIG. 4, another example is shown for a pump module 52 employing a plurality of diode laser modules 54 in a multi-stage combiner configuration. The diode modules provide fiber-coupled outputs 56 which are combined with first-stage pump fiber combiners 58. The combiners 58 provide first-stage combiner outputs 60 which are then coupled in a second-stage pump combiner 62. Second-stage pump combiner 62 may be the same or similar to first-stage combiner 58 depending on the brightness, power, or other requirements and characteristics of the multi-stage pump module 52. The light coupled into the second-stage combiner 62 is combined and provided as a pump module output 64, which can be polymer-clad or glass-clad or both, for subsequent optical coupling to a gain module (not shown).

Figure 5:
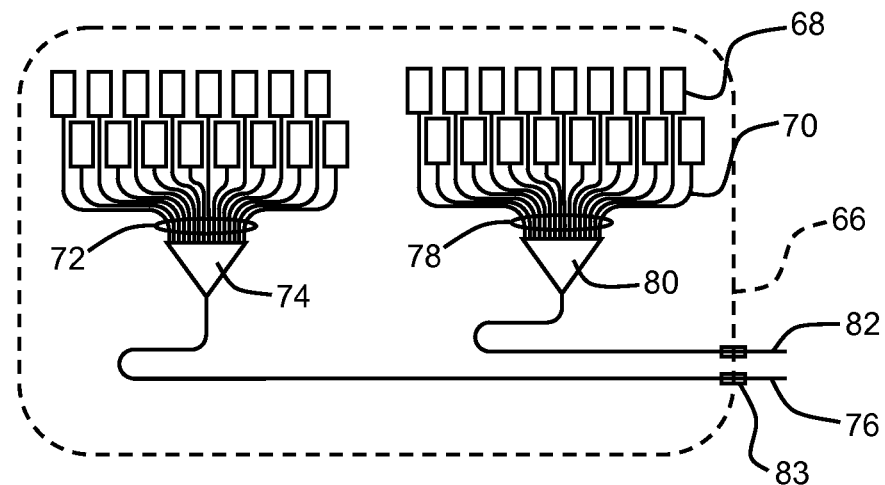
FIG. 5 is a schematic of another pump module of a fiber laser system in accordance with an aspect of the present invention.

In FIG. 5 another embodiment of a pump module 66 is shown providing a plurality of pump module outputs. Pump module 66 includes a plurality of diode laser modules 68 providing laser pump light to respective fiber-coupled output optical fibers 70. A first set of output optical fibers 72 is coupled into a first pump combiner 74. The pump light is combined with the pump combiner 74 and directed to a glass-clad or polymer-clad (or both) first pump module output 76. A second set of output optical fibers 78 is coupled into a second pump combiner 80. The second combiner 80 combines the received pump light and directs the light to a second glass-clad or polymer-clad (or both) pump module output 82. In other embodiments, pump module 66 has more than two pump module outputs. As shown, pump outputs 76, 82 include pluggable connectors 83 at a boundary of the pump module 66. Connectors 83 can facilitate the modularity of the pump modules herein by allowing separate patch cables to be used to connect pump modules and gain modules or by simplifying connection between pump modules and gain modules. However, optical splices can also be used to connect outputs of pump module 66 to gain modules herein.

Figure 6:
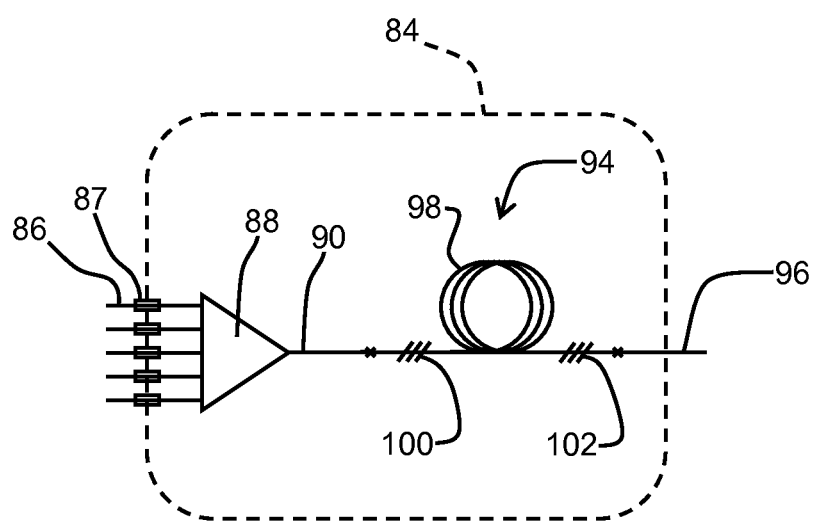
FIG. 6 is a schematic of a gain module of a fiber laser system in accordance with an aspect of the present invention.

In FIG. 6 an alternative embodiment of a gain module 84 is shown. Gain module 84 includes a plurality of polymer-clad, glass-clad, or both glass and polymer-clad pump inputs 86 which may be received from or may be the same as pump module outputs (not shown). As shown, pump inputs 86 are coupled into the gain module 84 via pluggable connectors 87, though optical splices may also be used. The pump inputs 86 are optically coupled to a gain module fused pump or pump-signal combiner 88 which combines received pump light and couples the light into gain module combiner output 90. The combined pump light of the combiner output 90 is coupled or spliced into a fiber laser oscillator 94 which converts incident pump power to a gain module output 96. The gain module output 96 can be used as a system output or it can be combined further with an additional module. The fiber laser oscillator 94 generally includes an optical gain fiber 98 in which the pump light is coupled and in which the gain module output 96 is generated, a high reflector 100 configured to reflect the laser energy to produce the output 96 and to transmit incoming pump light, and a partial reflector 102 configured to transmit at least a portion of the laser energy for output 96. The high and partial reflectors can be fiber Bragg gratings or other suitable reflective optical components.

Figure 7:
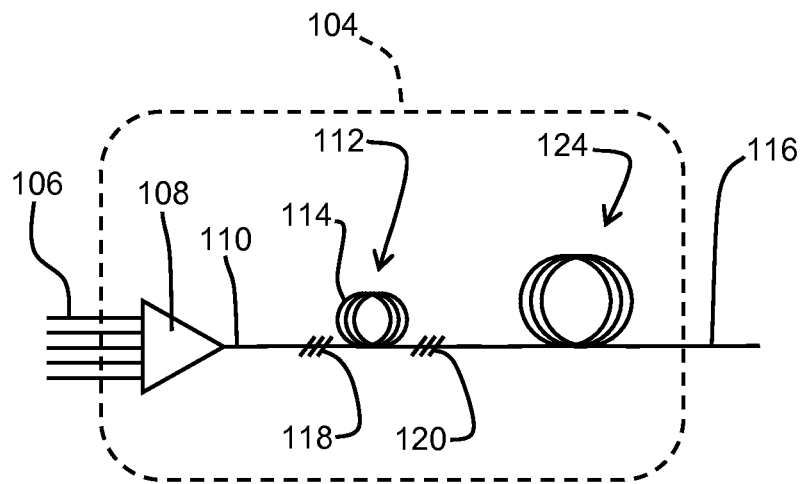
FIG. 7 is a schematic of another gain module of a fiber laser system in accordance with an aspect of the present invention.

In FIG. 7 another alternative embodiment of a gain module 104 is shown for a master oscillator power amplifier (MOPA) configuration. Gain module 104 includes a plurality of polymer-clad and/or glass-clad pump inputs 106 coupled to a gain module fused pump-signal or pump combiner 108. The combiner 108 receives pump light through the pump inputs 106 and combines and couples the beams into a combiner output fiber portion 110. The combined pump light of the combiner output 110 is coupled or spliced into a fiber laser oscillator 112 which converts a first portion of incident pump energy to signal energy for gain module output 116. The fiber laser oscillator 112 can include an optical gain fiber 114 in which the pump light is coupled and in which the signal energy of the gain module output 116 is generated, a high reflector 118 configured to reflect signal energy and to transmit incoming pump energy, and a partial reflector 120 configured to transmit at least a percentage of the signal energy. A first amplifier 124 receives the signal light and amplifies the power thereof with pump light energy. In other embodiments, one or more additional amplifiers can be added in sequence after first amplifier 124 to vary the maximum power rating and beam quality of the gain module output 116.

Figure 9:
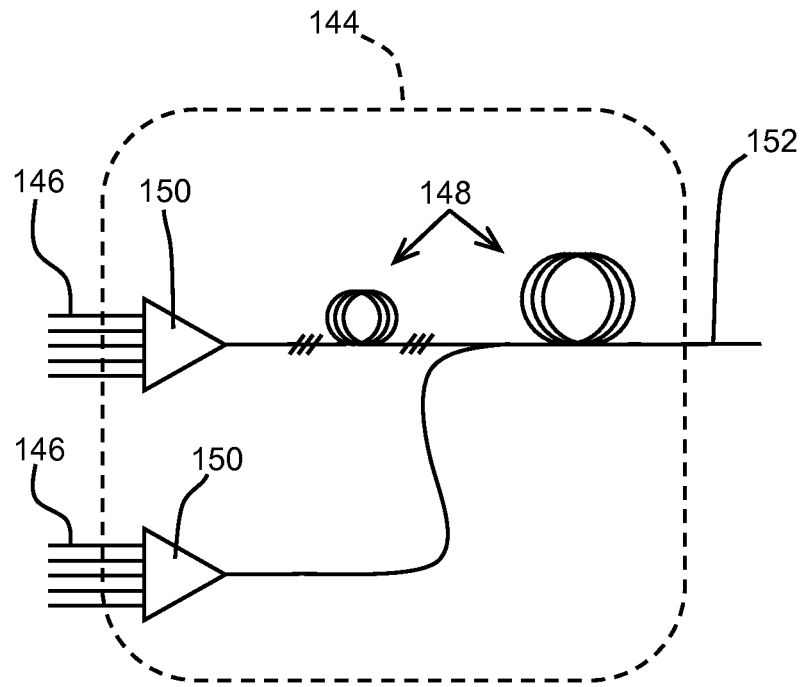
FIG. 9 is a schematic of another gain module of a fiber laser system in accordance with an aspect of the present invention.

In another embodiment of a gain module 144, shown in FIG. 9, the output fibers 146 from one or more pump modules are coupled into a gain fiber 148 using one or more pump-signal combiners 150 at one or more positions along the gain fiber 148 to provide side-pumping therein in order to produce a gain module signal output 152. The one or more pump-signal combiners 150 can be used in connection with gain fiber 148 in an oscillator configuration, such as the oscillator shown in FIG. 6, or a MOPA configuration as shown in FIG. 7. The combiners 150 can be used to couple light into the gain fiber 148 at various positions, including between the high reflector and the oscillator fiber, between the oscillator and amplifier fibers, between amplification stages, or some combination thereof. Moreover, pump light can be launched in the direction of the signal beam in a co-propagating manner, in the direction opposite the signal beam, i.e., in a counter-propagating manner, or both. In some examples providing side-pumping, a plurality of gain fibers 148 are disposed in the gain module in parallel so as to produce more than one gain module output 152. Similarly, it will be appreciated that for other various gain module embodiments herein a plurality of gain fibers can also be disposed therein in parallel so as to produce a plurality of gain module outputs.

Figure 10:
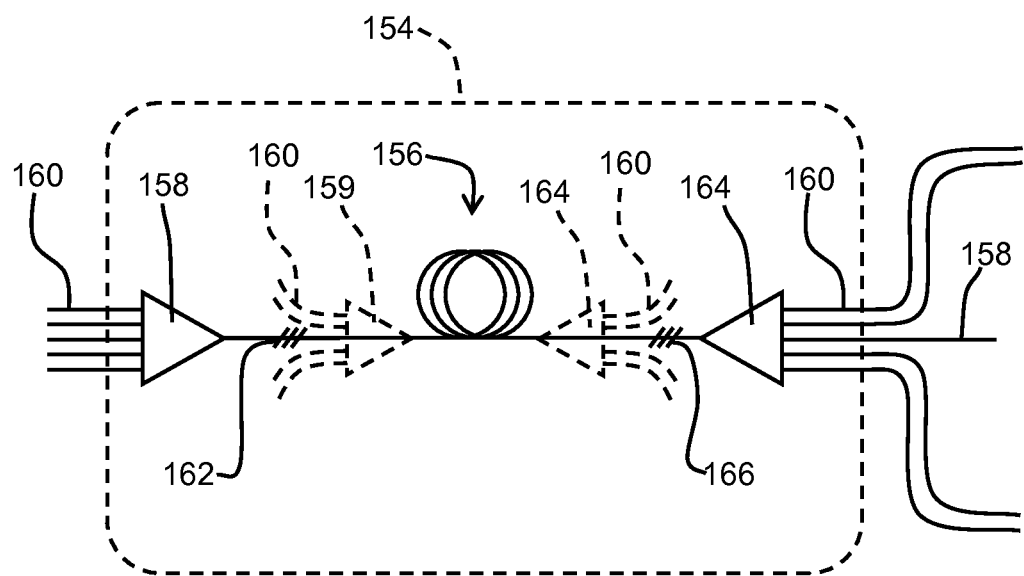
FIG. 10 is a schematic of another gain module of a fiber laser system in accordance with an aspect of the present invention.

In another embodiment of a gain module 154, shown in FIG. 10, an oscillator 156 is bi-directionally pumped to produce a gain module output 158. Pump light from one or more pump modules is launched via gain module input fibers 160 in the co-propagating direction using a combiner 158 such as a pump or pump-signal type before a high reflector 162 of the oscillator or a combiner 159 such as a pump-signal type between the high reflector 162 and the oscillator. In addition, pump light from one or more pump modules is launched in the counter-propagating direction using a pump-signal combiner 164 such as between the oscillator and a partial reflector 166 thereof or after the partial reflector.

Figure 8:
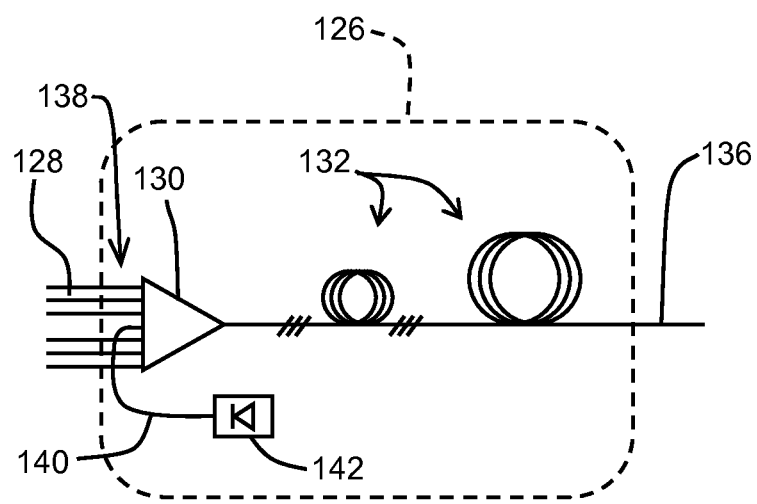
FIG. 8 is a schematic of another gain module of a fiber laser system in accordance with an aspect of the present invention.

In FIG. 8 there is shown an embodiment of a gain module 126 that includes a plurality of polymer-clad and/or glass-clad pump inputs 128, a gain module combiner 130 optically coupled to the inputs 128 so as to receive the pump light therefrom, and one or more gain fiber gain stages 132, such as oscillator and amplifier stages, coupled to the gain module combiner 130. The gain stages 132 receive the pump light and are operable to generate and amplify a signal beam to be provided at an output 136 of the gain module 126. As shown, an even or odd number of pump inputs 128 (in this case an even number of six inputs forming a 7×1 combiner) are coupled to the inputs 138 of the gain module combiner 130. A central polymer-clad and/or glass-clad input 140 is coupled to the combiner input 138. The central input 140 is optically coupled to an aiming laser 142, which directs a beam through the combiner 130, gain stages 132, and output 136 to provide an aiming beam that can be used to indicate the direction of a beam emitted from the output 136 of the gain module; the aiming beam is typically visible to the unaided eye, such as a red or a green wavelength.

Figure 11:
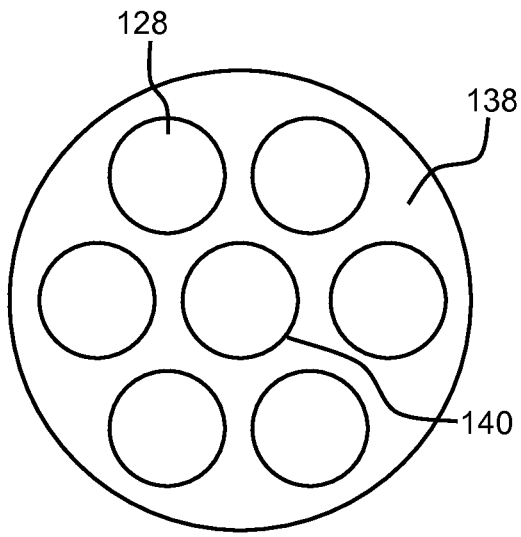
FIG. 11 is a rear view of a gain module combiner of a fiber laser system in accordance with an aspect of the present invention.
Figure 12:
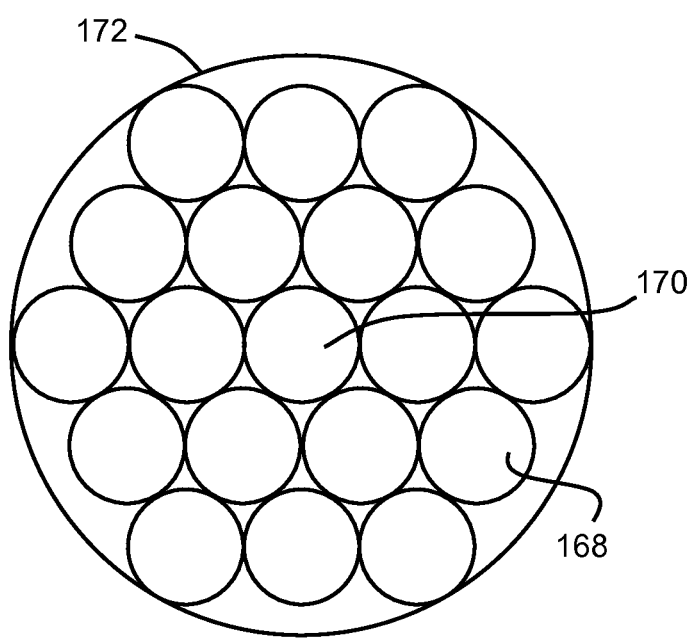
FIG. 12 is a rear view of another gain module combiner of a fiber laser system in accordance with an aspect of the present invention.

FIGS. 11 and 12 illustrate example arrangements of pump inputs received by various gain modules and coupled to combiners therein. FIG. 11 shows the arrangement on the combiner depicted in FIG. 8 where an even number of six pump inputs 128 are coupled to the input 138 around a central input 140 which can be an aiming laser input or another pump input. In FIG. 12 an arrangement of nineteen inputs 168 is shown, including a central input 170, coupled to a combiner 172. The central input 170 can be used for pumping or an aiming beam. In other examples, such as pump-signal combiner examples described herein, the central inputs can be dedicated to signal propagation. In various combiner examples herein, unused gain module combiner inputs can be paired and conveniently spliced together in the gain module for storage and future use and splicing of additional pump modules or after removal of pump modules. The spliced inputs can also recirculate pump light and signal light back through the gain module, potentially increasing gain module efficiency. Through recirculation, light that should otherwise be managed and heat sunk at the termination of the unused pump input can be redirected to designed heat sinking locations, for example, via one or more cladding light strippers, where supporting thermo-mechanical systems are configured to handle and remove the heat load.

Figure 13:
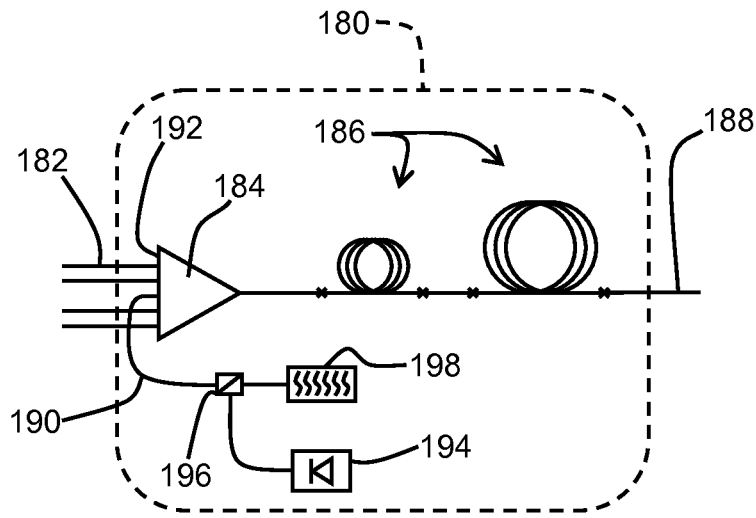
FIG. 13 is a schematic of another gain module of a fiber laser system in accordance with an aspect of the present invention.

In FIG. 13 another exemplary embodiment of a gain module 180 is shown that includes a plurality of pump inputs 182, a gain module combiner 184 optically coupled to the inputs 182, and one or more gain stages 186 coupled to the gain module combiner 184 and which produce a gain module output 188. A central polymer-clad and/or glass-clad fiber input 190 is coupled to a central location of an input 192 of the combiner. An aiming laser 194 is coupled to the central pump input 190 directly or with a beam-splitter 196. A beam dump 198 is also coupled to the central pump input 190 and is configured to receive, monitor, and heat sink or otherwise dispose of undesirable backward-propagating light from the gain module gain fiber. For example, light reflected at a target can become back-coupled into the gain module 180 through the output 188 thereof and cause damage to the one or more gain stages 186 or other components such as upstream pump modules.

Thus, it will be appreciated that some examples herein provide particular advantages over conventional approaches to configuring high power continuous-wave or quasi-continuous-wave fiber lasers in industrial settings. Herein, fiber laser power levels of 1 kW or more are achievable in a scalable and modular way such that multiple kilowatt output power can be selectably obtained. Pump sources become separated from the gain fiber and corresponding gain stages, improving serviceability, manufacturability, and field upgradeability and to take advantage of future advances in various component technologies. Variable pump module populations and ease of adjusting population enhances system flexibility and upgradeability in system output power.

Figure 14:
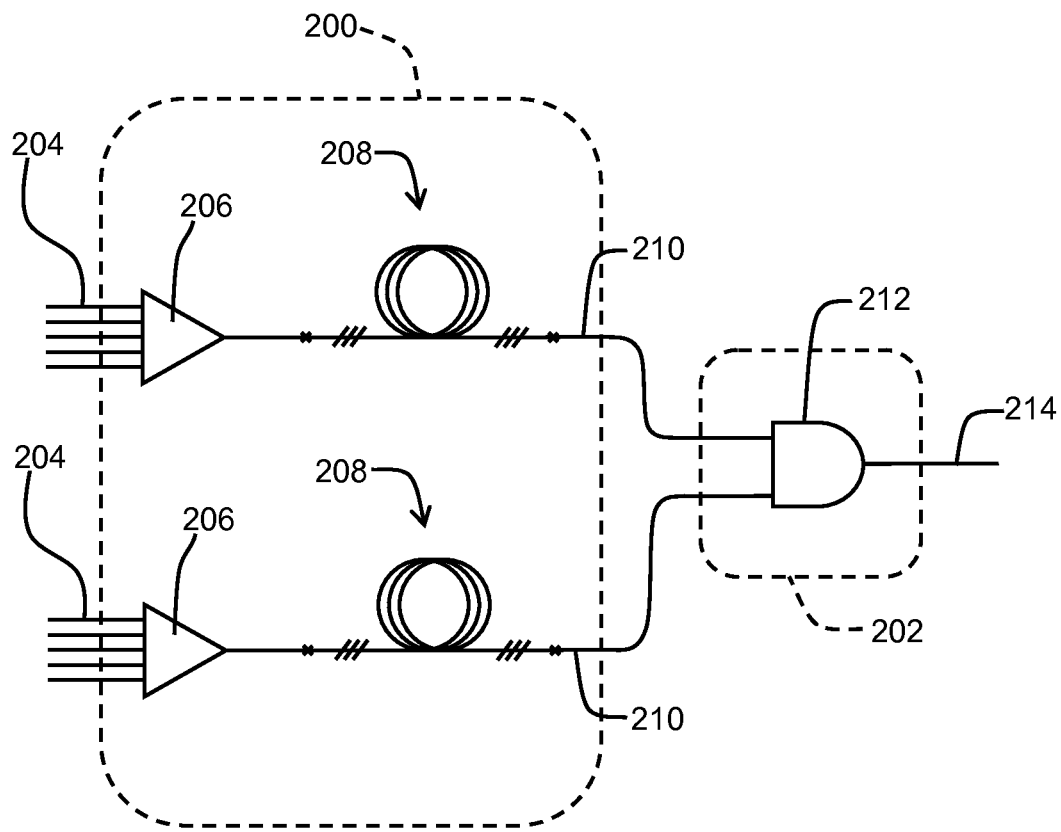
FIG. 14 is a schematic of a combiner stage in accordance with an aspect of the present invention.

In further examples, with reference FIG. 14, a gain module 200 and a combining module 202 are shown. The gain module includes two or more sets of pump inputs 204, each set coupled to a corresponding gain module combiner 206, and each combiner coupled to a corresponding one or more gain fiber gain stages 208. The separate sets of components can be configured to produce a plurality of gain module outputs 210 each with kW to multi-kW output levels. The separate multiple gain module outputs 210 can be used for various direct applications, or they can be coupled to combining module 202. The combining module utilizes a signal combiner 212 that can be modularized to be separate from gain module 200 or the signal combiner 212 thereof can be included instead as part of the gain module 200. The internal or external signal combiner 212 can be used to combine the various single-mode or multimode outputs 210 from the gain module 200 to produce a combined fiber output 214 capable of providing a very high power output beam in the multiple kW regime. For example, average power outputs of 4 kW, 6 kW, 8 kW, 10 kW, 12 kW or even higher can be achieved. In additional examples, separate gain modules can provide single gain module outputs that can be combined in combining stage 202 internal or external to gain module 200.

Figure 15:
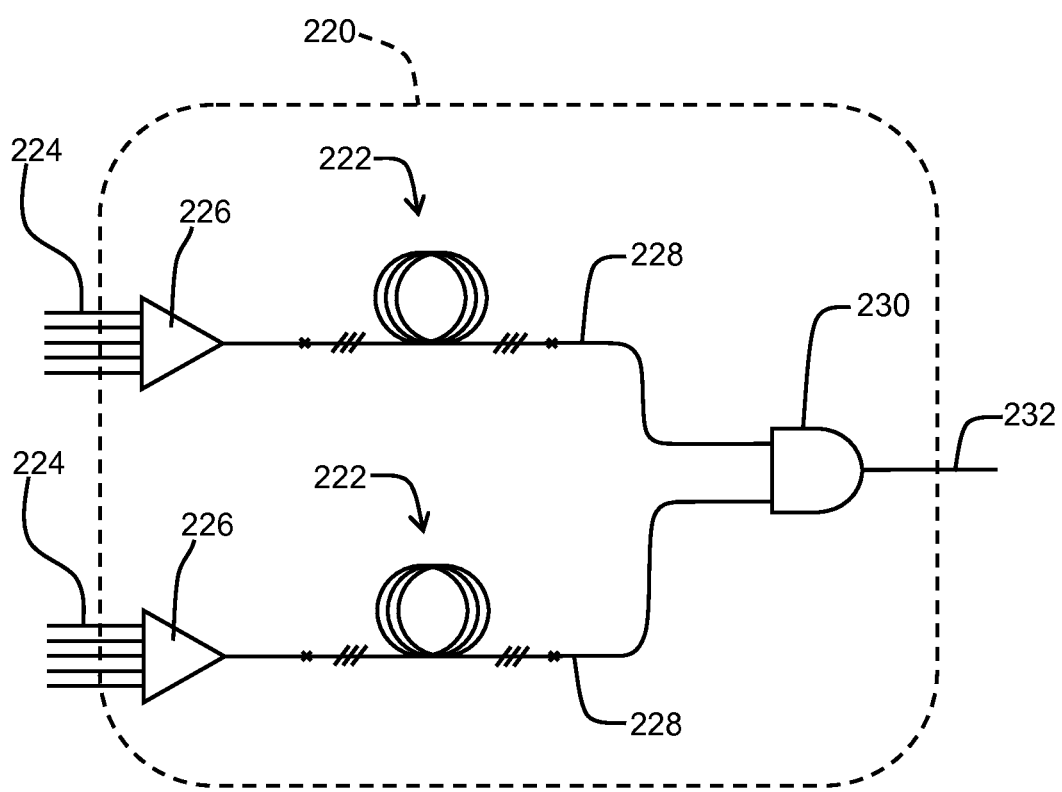
FIG. 15 is a schematic of another gain module of a fiber laser system in accordance with an aspect of the present invention.

In further examples, with reference to FIG. 15, a gain module 220 is shown that includes a pair of gain fibers 222 end-pumped by a plurality of pump inputs 224 coupled to the respective gain fibers 222 with combiners 226. High-power multimode or single-mode gain fiber outputs 228 are coupled into a signal combiner 230 that combines the high-power gain fiber outputs 228 into a single high-power output 232 of the gain module 220. In one example, gain fiber outputs provides optical powers of 4 kW respectively that are combined with the signal combiner 230 to provide a gain module output of about 8 kW. It will be appreciated that various output powers or ranges of output powers can be provided for gain module 220 by varying the number and type of scalable pump modules and pump inputs thereof coupled to the gain module 220 and also by varying the architecture of the gain module in accordance with the various embodiments and teachings herein. It is thought that the present invention and many of the attendant advantages thereof will be understood from the foregoing description, and it will be apparent that various changes may be made in the parts thereof without departing from the spirit and scope of the invention or sacrificing all of its material advantages, the forms hereinbefore described being merely exemplary embodiments thereof.

What is claimed is:

1. A modular and scalable high-power fiber laser system configurable to generate 1 kW or more of laser output, comprising:
   one or more separable pump modules separately disposed from each other, each pump module including a plurality of fiber-coupled component pump sources optically combined by one or more fiber-based pump module pump combiners, each pump module providing one or more pump module fiber outputs; and
   a gain module separately disposed from said one or more separable pump modules and including one or more gain module pump fiber inputs optically coupled to corresponding ones of said pump module fiber outputs, and including a gain fiber optically coupled to said one or more gain module pump fiber inputs, said gain fiber configured to generate a gain module fiber output power scalable in relation to the number and power of said pump module fiber outputs coupled to said gain fiber;
   wherein a path from each of said pump sources to the output of said gain module is all-fiber;
   wherein said gain module includes one or more pump or pump-signal combiners configured to optically couple said one or more gain module pump fiber inputs to said gain fiber, wherein said one or more gain module pump fiber inputs are coupled to an input of at least one of said one or more pump or pump-signal combiners at a central location concentric with a central axis and at one or more locations radially offset from said central axis; wherein an aiming beam is coupled into an aiming fiber coupled to said gain module pump fiber input coupled to said central location.

2. The system of claim 1, wherein said one or more gain module pump fiber inputs are optically coupled to said corresponding pump module fiber outputs at serviceable splice locations.

3. The system of claim 1, wherein said gain fiber is incorporated into a master fiber oscillator and fiber amplifier.

4. The system of claim 3, wherein said fiber amplifier includes two or more gain stages.

5. The system of claim 1, wherein said gain fiber is incorporated into a fiber oscillator.

6. The system of claim 1, wherein said gain fiber is pumped in one or more ways selected from the group consisting of co-pumping, counter-pumping, end-pumping, side-pumping, and bi-directionally pumping.

7. The system of claim 1, wherein said gain module output provides an output beam of about 1 kW or greater.

8. The system of claim 1, wherein said pump sources are fiber-coupled laser diode modules, each including a plurality of single-emitter diode lasers, the diode laser beams of which are collimated, combined, and focused into a pump source optical fiber.

9. The system of claim 1 further comprising at least another said gain module.

10. The system of claim 1 wherein said pump module fiber outputs are optically coupled to said gain module pump fiber inputs with pluggable connectors.

11. A modular and scalable high-power fiber laser system configurable to generate 1 kW or more of laser output, comprising:
one or more separable pump modules separately disposed from each other, each pump module including a plurality of fiber-coupled component pump sources optically combined by one or more fiber-based pump module pump combiners, each pump module providing one or more pump module fiber outputs; and
a gain module separately disposed from said one or more separable pump modules and including one or more gain module pump fiber inputs optically coupled to corresponding ones of said pump module fiber outputs, and including a gain fiber optically coupled to said one or more gain module pump fiber inputs, said gain fiber configured to generate a gain module fiber output power scalable in relation to the number and power of said pump module fiber outputs coupled to said gain fiber;
wherein a path from each of said pump sources to the output of said gain module is all-fiber;
wherein said gain module includes one or more pump or pump-signal combiners configured to optically couple said one or more gain module pump fiber inputs to said gain fiber;
wherein said one or more gain module pump fiber inputs are coupled to an input of at least one of said one or more pump or pump-signal combiners at a central location concentric with a central axis thereof and at one or more locations radially offset from said central axis;
wherein said gain module pump fiber input coupled to said central location provides a beam dump output for backward-propagating light in said gain fiber.

12. A modular and scalable high-power fiber laser system configurable to generate 1 kW or more of laser output, comprising:
one or more separable pump modules separately disposed from each other, each pump module including a plurality of fiber-coupled component pump sources optically combined by one or more fiber-based pump module pump combiners, each pump module providing one or more pump module fiber outputs; and
a gain module separately disposed from said one or more separable pump modules and including one or more gain module pump fiber inputs optically coupled to corresponding ones of said pump module fiber outputs, and including a gain fiber optically coupled to said one or more gain module pump fiber inputs, said gain fiber configured to generate a gain module fiber output power scalable in relation to the number and power of said pump module fiber outputs coupled to said gain fiber;
wherein a path from each of said pump sources to the output of said gain module is all-fiber, wherein said gain module includes one or more pump or pump-signal combiners configured to optically couple said one or more gain module pump fiber inputs to said gain fiber;
wherein at least two of said gain module pump fiber inputs are unused and paired off via splicing.

13. A modular and scalable high-power fiber laser system configurable to generate 1 kW or more of laser output, comprising:
one or more separable pump modules separately disposed from each other, each pump module including a plurality of fiber-coupled component pump sources optically combined by one or more fiber-based pump module pump combiners, each pump module providing one or more pump module fiber outputs; and
a gain module separately disposed from said one or more separable pump modules and including one or more gain module pump fiber inputs optically coupled to corresponding ones of said pump module fiber outputs, and including a gain fiber optically coupled to said one or more gain module pump fiber inputs, said gain fiber configured to generate a gain module fiber output power scalable in relation to the number and power of said pump module fiber outputs coupled to said gain fiber;
a cooling system coupled to said gain module and said one or more pump modules such that each module is thermally isolated from each other module;
wherein a path from each of said pump sources to the output of said gain module is all-fiber.

14. The system of claim 13, wherein said gain module includes one or more combiners of the pump or pump-signal type, said combiners configured to optically couple said one or more gain module pump fiber inputs to said gain fiber.

15. The system of claim 14, wherein said one or more gain module pump fiber inputs are coupled to an input of said combiner at a central location concentric with a central axis thereof and at one or more locations radially offset from said central axis.

16. The system of claim 15, wherein an aiming beam is coupled into an aiming fiber coupled to said gain module pump fiber input coupled to said central location.

17. The system of claim 13, wherein said pump sources are fiber-coupled laser diode modules, each including a plurality of single-emitter diode lasers, the diode laser beams of which are collimated, combined, and focused into a pump source optical fiber.

18. The system of claim 13, wherein said gain fiber comprises a one or more of a fiber oscillator and fiber amplifier.

19. A modular and scalable high-power fiber laser system configurable to generate 1 kW or more of laser output, comprising:
one or more separable pump modules separately disposed from each other, each pump module including a plurality of fiber-coupled component pump sources optically combined by one or more fiber-based pump module pump combiners, each pump module providing one or more pump module fiber outputs; and
a gain module separately disposed from said one or more separable pump modules and including one or more gain module pump fiber inputs optically coupled to corresponding ones of said pump module fiber outputs, and including a gain fiber optically coupled to said one or more gain module pump fiber inputs, said gain fiber configured to generate a gain module fiber output power scalable in relation to the number and power of said pump module fiber outputs coupled to said gain fiber;
wherein a path from each of said pump sources to the output of said gain module is all-fiber;
wherein said gain module includes a signal combiner configured to receive a plurality of signal beams produced in said gain module and to combine the signal beams to form a high-power output of the fiber laser system.

20. The system of claim 19, wherein said gain module includes one or more combiners of the pump or pump-signal type, said combiners configured to optically couple said one or more gain module pump fiber inputs to said gain fiber.

* * * * *